(12) United States Patent
Hamamoto et al.

(10) Patent No.: US 10,150,132 B2
(45) Date of Patent: Dec. 11, 2018

(54) THIN FILM FABRICATING APPARATUS, AND MANUFACTURING METHOD OF ORGANIC LIGHT EMITTING DEVICE USING THE SAME, AND ORGANIC LIGHT EMITTING DEVICE MANUFACTURED USING THE SAME

(71) Applicant: SAMSUNG ELECTRONICS CO., LTD., Suwon-si (KR)

(72) Inventors: Nobuo Hamamoto, Suwon-si (KR); Miyazaki Hiroshi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 111 days.

(21) Appl. No.: 15/041,967

(22) Filed: Feb. 11, 2016

(65) Prior Publication Data

US 2017/0069842 A1 Mar. 9, 2017

(30) Foreign Application Priority Data

Sep. 3, 2015 (KR) .................. 10-2015-0124839

(51) Int. Cl.
*B05B 12/20* (2018.01)
*B05B 5/025* (2006.01)
(Continued)

(52) U.S. Cl.
CPC ............ *B05B 12/20* (2018.02); *B05B 5/0255* (2013.01); *B05B 5/0533* (2013.01);
(Continued)

(58) Field of Classification Search
CPC ....... B05B 5/053; B05B 5/0536; B05B 5/087; H01L 27/32; B01J 2219/00371;
(Continued)

(56) References Cited

U.S. PATENT DOCUMENTS 4,219,864 A * 8/1980 Grunenfelder .......... B05B 5/025
239/704
4,264,641 A * 4/1981 Mahoney ................ B05B 5/025
148/403
(Continued)

FOREIGN PATENT DOCUMENTS

JP 2002511792 4/2002
JP 2007229851 9/2007
(Continued)

OTHER PUBLICATIONS

A. Jaworek, et al., "Electrospraying route to nanotechnology: An overview", Journal of Electrostatics, vol. 66, (2008), pp. 197-219.
(Continued)

*Primary Examiner* — Karl Kurple
(74) *Attorney, Agent, or Firm* — Cantor Colburn LLP

(57) ABSTRACT

A thin film fabricating apparatus includes an electrode part which sprays a thin film material as electrified spray particles, a substrate holder disposed facing the electrode part and holding a substrate to be provided with a thin film, and a mask disposed between the electrode part and the substrate holder and provided with a plurality of pattern grooves, where the mask and the substrate are applied with a mask voltage (Vm) and a substrate voltage (V0), respectively, the mask voltage (Vm) is a variable voltage, and the mask voltage (Vm) has the same polarity as the polarity of spray particles.

20 Claims, 24 Drawing Sheets

(51) Int. Cl.
*B05B 5/08* (2006.01)
*B05B 5/053* (2006.01)
*B05C 21/00* (2006.01)
*H01L 51/56* (2006.01)
*B05D 1/32* (2006.01)
*C23C 14/04* (2006.01)
*H01L 51/00* (2006.01)

(52) U.S. Cl.
CPC ............ *B05B 5/0536* (2013.01); *B05B 5/087* (2013.01); *B05C 21/005* (2013.01); *B05D 1/32* (2013.01); *C23C 14/042* (2013.01); *H01L 51/0003* (2013.01); *H01L 51/56* (2013.01)

(58) Field of Classification Search
CPC ...... H01J 49/165; B01L 2400/27; B05D 1/04; H05K 2203/105
See application file for complete search history.

(56) References Cited

U.S. PATENT DOCUMENTS

| | | | |
|---|---|---|---|
| 5,238,709 | A | 8/1993 | Wilkie |
| 5,344,676 | A * | 9/1994 | Kim ................. B05B 5/0255 118/621 |
| 5,910,220 | A * | 6/1999 | Zuhr ................. B05D 1/06 118/723 CB |
| 6,350,609 | B1 * | 2/2002 | Morozov ............ B01J 19/0046 205/158 |
| 6,696,105 | B2 * | 2/2004 | Hiroki ................. H01L 51/0005 427/282 |
| 6,787,313 | B2 | 9/2004 | Morozov et al. |
| 8,166,911 | B2 * | 5/2012 | Selman ................. B05B 5/025 118/504 |
| 8,840,037 | B2 * | 9/2014 | Stark ................... H01J 49/165 239/101 |
| 9,032,905 | B2 * | 5/2015 | Kauppinen .......... B05B 5/03 118/621 |
| 9,162,449 | B2 | 10/2015 | Byun et al. |
| 9,211,551 | B2 * | 12/2015 | Stark ................... B05B 5/0255 |
| 2003/0150739 | A1 | 8/2003 | Morozov et al. |
| 2007/0202258 | A1 * | 8/2007 | Yamagata ............ B01L 3/0268 427/282 |
| 2008/0029026 | A1 * | 2/2008 | Selman ................. B05B 5/025 118/621 |
| 2011/0017134 | A1 | 1/2011 | Tanioka et al. |
| 2013/0078387 | A1 * | 3/2013 | Kauppinen ............ B05B 5/03 427/475 |
| 2015/0273495 | A1 * | 10/2015 | Tokoh .................. B05B 5/0255 118/624 |

FOREIGN PATENT DOCUMENTS

| | | |
|---|---|---|
| JP | 2007305507 | 11/2007 |
| JP | 2011175921 | 9/2011 |
| JP | 2012135704 | 7/2012 |
| JP | 2014180590 | 9/2014 |
| JP | 2015054269 | 3/2015 |
| KR | 10-0263844 | 5/2000 |
| KR | 1020100021609 | 2/2010 |
| KR | 1020100042345 | 4/2010 |
| KR | 1020150024649 | 3/2015 |
| WO | 9858745 | 12/1998 |
| WO | 2008044737 | 4/2008 |
| WO | 2009060898 | 5/2009 |
| WO | 2013105557 | 7/2013 |
| WO | 2013105558 | 7/2013 |

OTHER PUBLICATIONS

J.M. Lopez-Herrera, et al., "Coaxial jets generated from electri ed Taylor cones. Scaling laws", Aerosol Science, vol. 34, (2003), pp. 535-552.

Lord Rayleigh, "Equililn'ium of Liquld", Phil. Mag., vol. 14, (1882), p. 184-186.

N. Hamamoto et al., "Experimental Discussion on Maximum Surface Charge Density of Fine Particles Sustainable in the Atmosphere", vol. 15, No. 6, (1991), pp. 452-458.

Yasushi Koishikawa, et al., "Multi-layered organic light-emitting diode fabrication using low molecular weight materials by electrospray method", Thin Solid Films, vol. 545, (2013), pp. 527-532.

Yoshiyuki Seike, et al., "The Study of Film Formation Process by Electrospray Method to Manufacture High Productivity Organic Light-emitting Diode Devices", Thin Solid Films, vol. 545, (2013), p. 527.

* cited by examiner (Vm < Vms)

(Vm = Vm1)

THIN FILM FABRICATING APPARATUS, AND MANUFACTURING METHOD OF ORGANIC LIGHT EMITTING DEVICE USING THE SAME, AND ORGANIC LIGHT EMITTING DEVICE MANUFACTURED USING THE SAME

CROSS REFERENCE TO RELATED APPLICATIONS

This application claims priority to Korean Patent Application No. 10-2015-0124839, filed on Sep. 3, 2015, and all the benefits accruing therefrom under 35 U.S.C. § 119, the content of which in its entirety is herein incorporated by reference.

BACKGROUND

1. Field

Exemplary embodiments of the invention relate to a thin film fabricating apparatus, an organic light emitting device using the same, and a method of manufacturing the organic light emitting device.

2. Description of the Related Art

An organic light emitting device (hereinafter referred to as an organic EL device) is a current-driving type of light emitting element using luminescence generated by recombining electrons and holes which are injected in an organic thin film in dual-faced electrodes, where the current-driving type of light emitting element is obtained by providing electrodes on both opposite surfaces of a thin film made of an organic material and applying a voltage between the facing electrodes to induce electrons and holes injected into the organic thin film to be recombined. As it may provide high luminescent brightness at a low voltage and high visibility, and may emit light by itself, the organic light emitting device has been actively researched for a light-weight and thin display.

The current method of manufacturing an organic thin film generally used for the organic light emitting device includes a dry process such as vacuum deposition and a wet process such as a spin coating. The dry process is a coating process using a relatively low molecular organic material and has characteristics of easily controlling a thickness, partitioning a coating region using a mask having appropriately-sized openings, and easily providing a structure of stacking organic materials having different properties. In the process, a "multi-layered technique" easily providing a stacking structure is particularly important. As the luminous efficiency and the device life-span of the organic light emitting device have remarkably improved, the organic light emitting device may be employed for many applications as a practicable display. However, as this technique requires a vacuum device, the current method has limitations of improving productivity and saving cost due to a high cost for initial introduction and maintenance of the device, as well as difficulty in using this technique for a large-sized substrate.

The wet process is applicable for a polymer material having excellent physical stability such as a coating property or heat resistance, and the apparatus is simple and does not require a specific atmosphere such as a vacuum, so the wet process is considered to be suitable for mass production and for manufacturing a low cost product. However, to accomplish the high efficiency and a long life span, it is important to provide a stacking structure using materials having different properties, but the wet process causes problems in that a solvent of an upper thin film material dissolves and is permeated into the lower organic material to delaminate the lower layer, so these problems need to be prevented. In order to solve the problems, additives such as a cross-linking hardener may be used, but the additives are known for inhibiting the light emitting property. Thereby, there are many difficulties in accomplishing a high performance multi-layer structure causing no loss of the device function.

There are several suggestions to apply an electro-spray method (hereinafter referred to as an ES method) to manufacturing an organic EL device due to a simple patterning. The ES method includes spraying a solution of a functional material while applying a high voltage between a conductive substrate and a nozzle discharging the solution to attach the same to the substrate. The electrified solution may be changed into fine liquid droplets having a nano-scale by mutual repulsion and dispersion, and the solvent is evaporated by rapidly increasing the surface area to attach only a solute (e.g., organic material) in the solution as a dried state onto the substrate to provide a uniform layer, to stack a plurality of layers.

SUMMARY

An electro-spray method (hereinafter referred to as an ES method) method may provide several nano-order-sized layers on the substrate, but treatment time is generally very prolonged, so processes which have been proposed up to now are not suitable for mass production. The known ES techniques include those in Japanese Patent Laid-Open Publication No. 2011-175921, WO 2008-044737, WO 2009-060898, Japanese Patent Laid-Open Publication No. 2007-229851, or the like, but they lack practicality since material loss is excessive for mass production, and the thickness distribution of a thin film stacked on the substrate is not uniform, and when the thin film is formed by, for example, "a sheetfed mode", it has problems of necessarily requiring a physical shutter whenever the substrate is replaced.

The conventional art has problems of a lack of practicality in mass production since the thin film stacked on the substrate has an irregular thickness distribution, material loss is excessive, and the apparatus is complicated since the physical shutter is included as an essential component for the sheetfed method. Accordingly, a thin film fabricating apparatus is required to be applicable for mass production, and to provide a uniform nano-order layer in a stable and uniform thickness, and at the same time, to be easily employed for the sheetfed method without a physical shutter.

According to one exemplary embodiment, a thin film fabricating apparatus includes an electrode part which sprays a thin film material as electrostatic spray particles, a substrate holder disposed facing the electrode part and holding a substrate to be provided with a thin film, and a mask disposed between the electrode part and the substrate holder and provided with a plurality of pattern grooves, where the mask and the substrate are applied with a mask voltage (Vm) and a substrate voltage (V0), respectively, the mask voltage (Vm) is a variable voltage, and the mask voltage (Vm) has the same polarity as the polarity of the spray particles.

In an exemplary embodiment, when the mask voltage (Vm) is greater than or equal to the shutter voltage (Vms), a thin film may not be disposed on the substrate, and the shutter voltage (Vms) may satisfy Equation 1.

$$Vms = V0 + 1.07 \times 10^{-8} \times \frac{Va}{L \times CL^{1.2}} \qquad \text{[Equation 1]}$$

Herein, a dominant voltage (Va) is a voltage of the electrode part nearest to the mask, L is the shortest distance between the mask and the electrode part, and CL is the shortest distance between the substrate and the mask.

In an exemplary embodiment, the electrode part includes a plurality of needle electrodes, and the needle electrode may be applied with the dominant voltage (Va).

In an exemplary embodiment, the electrode part may include a plurality of needle electrodes and a plurality of ring electrodes disposed on positions respectively corresponding to the needle electrodes, and the plurality of ring electrodes may be applied with the dominant voltage (Va).

In an exemplary embodiment, each of the needle electrodes may be disposed on the center axis of the ring electrode.

In an exemplary embodiment, the electrode part may include a plurality of needle electrodes, a plurality of ring electrodes disposed on positions respectively corresponding to the ring electrodes, and a grid electrode disposed between the ring electrode and the mask, where the grid electrode may be applied with the dominant voltage (Va).

In an exemplary embodiment, the absolute value of the dominant voltage (Va) may be greater than the absolute value of the shutter voltage (Vms).

In an exemplary embodiment, the shutter voltage (Vms), the substrate voltage (V0), and the dominant voltage (Va) may satisfy Inequation 2.

$$\frac{(Vms - V0)}{Va} > 0 \qquad \text{[Inequation 2]}$$

In an exemplary embodiment, the shortest distance between the substrate and the mask may be about 30 micrometers ($\mu m$) to about 3 millimeters (mm).

In an exemplary embodiment, the mask may have a thickness of about 50 $\mu m$ to about 5 mm.

In an exemplary embodiment, the absolute value of a shutter voltage may be about 1.5 volts (V) to about 100 V.

In an exemplary embodiment, the absolute value of the dominant voltage may be about 500 V to about 20,000 V.

In an exemplary embodiment, the absolute value of the substrate voltage (V0) may be greater than 0 V and less than or equal to about 100 V.

In an exemplary embodiment, the shortest distance between the mask and the electrode part may be about 0.005 meter (m) to about 0.3 m.

Supposing the period of forming a thin film on the substrate is an aging time, the mask voltage (Vm) may show a periodic waveform during the aging time.

In an exemplary embodiment, the absolute value of the mask voltage (Vm) may be about 1 V to about 100 V during the aging time.

In an exemplary embodiment, the mask voltage (Vm) may include a first voltage (Vm1) and a second voltage (Vm2) greater than the absolute value of the first voltage (Vm1).

In an exemplary embodiment, the mask voltage (Vm) may further include a third voltage (Vm3) greater than the absolute value of the second voltage (Vm2).

In an exemplary embodiment, the first voltage (Vm1) may be applied for greater than or equal to about 75 percent (%) of the aging time of the mask voltage (Vm).

In an exemplary embodiment, the second voltage (Vm2) may be applied for about 1 to about 20% of the aging time of the mask voltage (Vm).

In an exemplary embodiment, the third voltage (Vm3) may be applied for about 0.1% to about 5% of the aging time of the mask voltage (Vm).

In an exemplary embodiment, a plurality of spacers may be disposed between the mask and the substrate.

A method of manufacturing an organic light emitting device including forming at least one organic film using the thin film fabricating apparatus according to one exemplary embodiment, and an organic light emitting device including at least one organic film provided by using the thin film fabricating apparatus according to one exemplary embodiment, may be provided.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
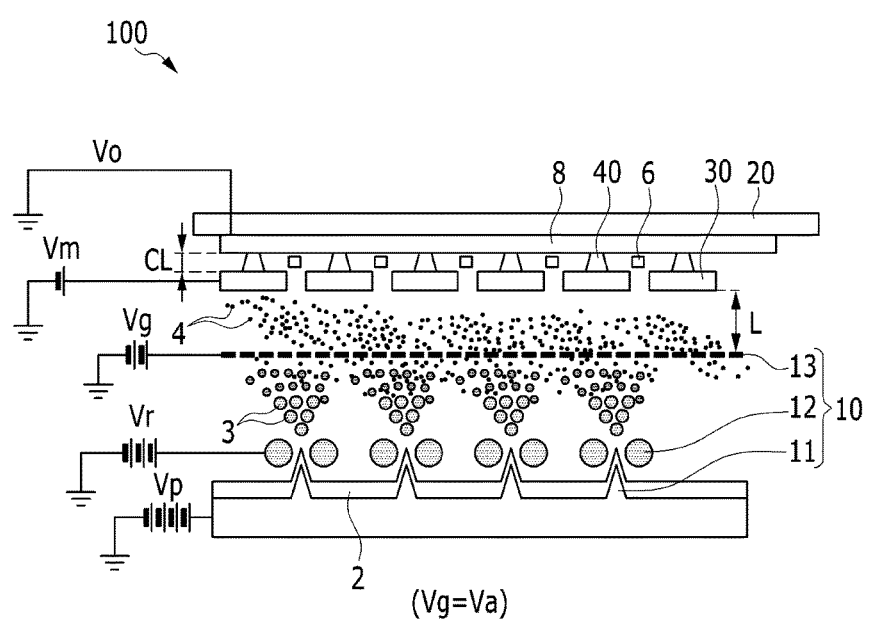
FIG. 1 is a schematic view of a thin film fabricating apparatus according to one exemplary embodiment.

Exemplary embodiments of the invention will hereinafter be described in detail, and may be easily performed by those who have common knowledge in the related art. However, this disclosure may be embodied in many different forms, and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
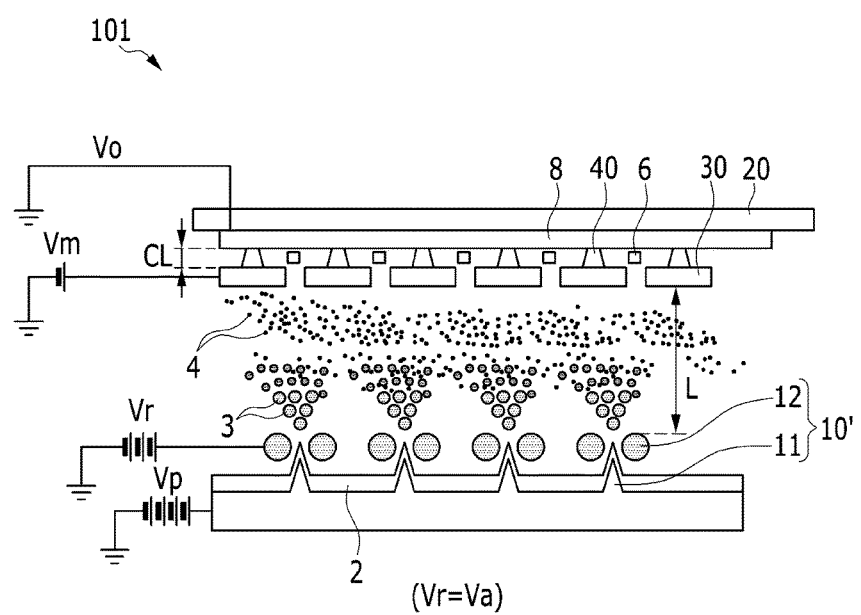
FIGS. 2 to 4 are schematic views of various thin film fabricating apparatuses according to exemplary embodiments modified from FIG. 1.
Figure 3:
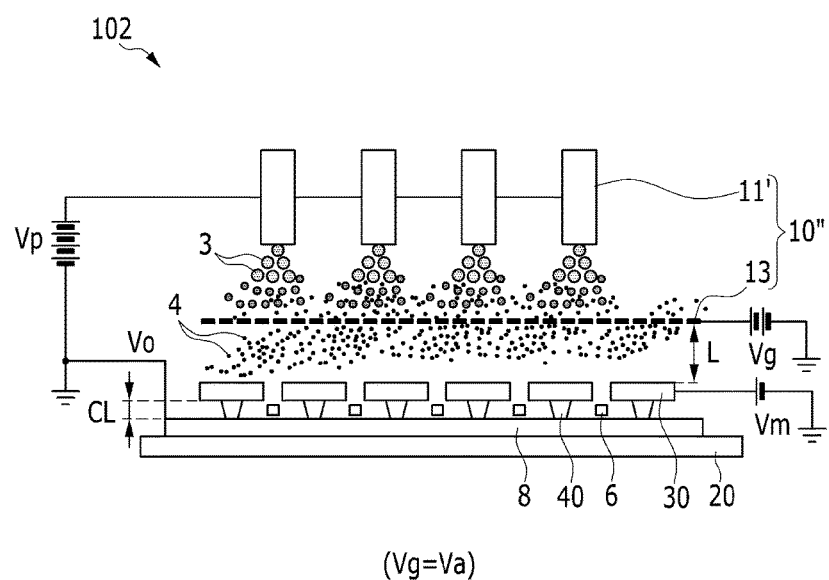
Figure 4:
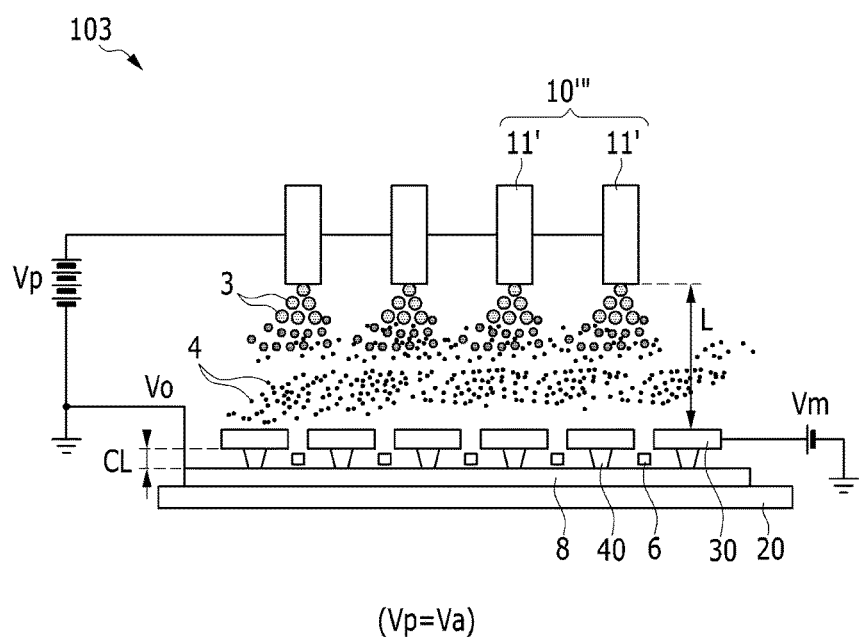

FIG. 1 is a schematic view of a thin film fabricating apparatus according to one embodiment, and FIGS. 2 to 4 are schematic views showing the various thin film fabricating apparatuses according to the modified exemplary embodiments form FIG. 1.

The thin film fabricating apparatus 100 according to one embodiment includes an electrode part 10 spraying a thin film material 2 as electrified spray particles, a substrate holder 20 disposed facing the electrode part 10 and holding a substrate 8 to be provided with a thin film, and a mask 30 disposed between the electrode part 10 and the substrate holder 20 and provided with a plurality of pattern grooves.

Although FIG. 1 shows a structure in which a substrate holder 20, a substrate 8, a mask 30, and an electrode part 10 are disposed from the upper part to the lower part of the thin film fabricating apparatus 100 to provide a thin film 6 on the substrate 8 held on the upper part, it is not limited thereto. That is, in an exemplary embodiment, an electrode part 10, a mask 30, a substrate 8, and a substrate holder 20 are disposed from the upper part to the lower part of a thin film fabricating apparatus 100 to provide a thin film 6 on the substrate 8 disposed on the lower part. In other words, the internal disposition relationship of the thin film fabricating apparatus 100 and the direction of forming a thin film 6 may be changed in various forms to provide a thin film 6 on the surface of the substrate 8.

The electrode part 10 sprays a thin film material 2 as a plurality of liquid droplets 3, and the plurality of liquid droplets 3 are divided into nano-order spray particles 4. In order to accomplish the same, the electrode part 10 of the thin film fabricating apparatus 100 according to one embodiment may include a plurality of needle electrodes 11, a plurality of ring electrodes 12, and a grid electrode 13.

In an exemplary embodiment, the plurality of needle electrodes 11 may be disposed at regular intervals, and may have various sharp and pointed shapes to provide a Taylor cone, for example. In an exemplary embodiment, the needle electrode 11 may include stainless steel (SUS), tungsten (W), platinum (Pt), or the like, for example.

In an exemplary embodiment, the interval of needle electrodes 11 may be irregular and may be changed to a predetermined pattern. In an exemplary embodiment, the needle electrodes 11 may have a height greater than the height of the thin film material 2. Thereby, the thin film material 2 is gathered on the terminal end of the needle electrodes 11 to provide a Taylor cone and may be sprayed in a form of liquid droplets 3 from the terminal end of the Taylor cone.

The needle electrodes 11 may be disposed to be immersed in the thin film material 2, as shown in FIG. 1, and the thin film material 2 supplied from the inside of the needle electrodes 11 may be discharged in liquid droplets 3 at the terminal end of the needle electrodes 11 by applying a high voltage to the terminal end of the needle electrodes 11.

The needle electrodes 11 may be applied with a needle voltage (Vp) which is a variable voltage, and the details of the needle voltage (Vp) will be described in detail later.

A plurality of ring electrodes 12 is arranged with the needle electrodes 11 to dispose the centers of the plurality of ring electrodes 12 on extension lines of the needle electrodes 11, respectively, and are spaced apart from the upper surface of the thin film material 2 and also spaced apart from the surface of the mask 30. The ring electrodes 12 plays a role of guiding the propagating direction of the liquid droplets 3 sprayed from the needle electrodes 11.

The ring electrodes 12 may be disposed in a line or a matrix to electrically connect with each other, and the ring electrodes 12 may be applied with a ring voltage (Vr) which is a variable voltage. The details of ring voltage (Vr) will be described in detail later.

The grid electrode 13 is spaced apart from each surface of the ring electrodes 12 and the mask 30. In an exemplary embodiment, the grid electrode 13 may include stainless steel (SUS), tungsten (W), gold (Au), platinum (Pt), or the like, for example.

In an exemplary embodiment, the grid electrode 13 may have a shape of about 50 mesh to about 500 mesh, for example. The sprayed liquid droplets 3 may be dispersed as spay particles 4 between the needle electrode 11 and the grid electrode 13 in several tens of microns to a nano-order.

The grid electrode 13 may be applied with a grid voltage (Vg) which is a variable voltage, and the details of the grid voltage (Vg) will be described in detail later.

The scope of the invention is not limited to the electrode part 10 including all of the needle electrode 11, the ring electrode 12, and the grid electrode 13, but as shown in the thin film fabricating apparatus 101 of FIG. 2, an electrode part 10' may include only a needle electrode 11 and a ring electrode 12, or as shown in the thin film fabricating apparatus 102 of FIG. 3, the electrode part 10'' may include only a needle electrode 11' and a grid electrode 13, or as shown in the thin film fabricating apparatus 103 of FIG. 4, the electrode part 10''' may include only a needle electrode 11'. Differences of thin film forming processes depending upon the electrode parts (10', 10'', and 10''') shown in FIGS. 2 to 4 will be described in detail later.

The substrate holder 20 is a device for disposing a substrate 8 to be provided with a thin film on a needle electrode 11, a ring electrode 12, and a grid electrode 13, and the substrate holder 20 holds the substrate 8 using a holding element and introduces the same into a thin film forming region and disposes the same on the needle electrode 11, the ring electrode 12, and the grid electrode 13. The substrate holder 20 may be disposed in parallel with the mounted substrate 8.

The substrate holder 20 and the substrate 8 may be applied with a substrate voltage (V0). In an exemplary embodiment, the substrate voltage (V0) may have a potential of 0 V which is a ground potential, but the substrate voltage may be applied with a very weak potential having the opposite polarity to the electrification of spray particles to more actively attach the spray particles 4 onto the substrate.

The mask 30 is spaced apart from the substrate 8 in parallel therewith, and is provided with a plurality of patterned grooves on the surface thereof. The spray particles 4 pass through the patterned groove of the mask 30 from the electrode part 10 and are attached to the substrate 8 by electrostatic attractive force, so as to provide the thin film 6. The mask 30 may control the pattern of the thin film to be provided by adjusting a shape or a size of the pattern groove or the like.

According to one exemplary embodiment, the mask 30 has a thickness of, for example, about 50 micrometer (μm) to about 5 millimeters (mm), or for example, about 50 μm to about 3 mm. When the mask 30 has the thickness within the range, the mask 30 is not deflected, so as to pattern a high-definition thin film 6.

The mask 30 may be applied with a mask voltage (Vm) which is a variable voltage. The mask voltage (Vm) may be controlled to have the same polarity as the polarity of the dispersed spray particles 4. In other words, when the spray particles 4 are electrified with a positive charge, the mask voltage (Vm) may be controlled to also have a positive charge.

In this way, according to one exemplary embodiment, the polarity of the spray particles 4 is adjusted to have the same polarity as the mask voltage (Vm) to control how much the spray particles 4 form a thin film 6 or to block the forming of a thin film. The details of the controlling of a mask voltage (Vm) and the driving of a thin film formation will be described in detail later.

The thin film fabricating apparatus 100 according to one exemplary embodiment may further include a plurality of spacers 40 disposed at regular intervals between the mask 30 and the substrate 8. All the plurality of spacers 40 may have the same height to define a space between the mask 30 and the substrate 8 that are parallel to each other.

The spacer 40 includes an insulating material to insulate the mask 30 and the substrate 8, so that the potential difference may be maintained without the mask voltage (Vm) and the substrate voltage (V0) interacting with each other.

When the potential difference is 0 V by contacting the mask 30 and the substrate 8 to each other, thin films are disposed on surfaces of both the mask 30 and the substrate 8 which have equipotential, thereby causing problems of a huge loss of the thin film materials 2 and the precision deterioration of the obtained thin film 6.

However, the thin film fabricating apparatus 100 according to one exemplary embodiment electrically insulates between the mask 30 and the substrate 8 by disposing insulating spacers 40 between the mask 30 and the substrate 8, so that a thin film 6 is not disposed on the surface of the mask 30 to reduce the loss of the thin film material 2 and also to improve the precision of forming a thin film 6.

The voltages applied to each of the needle electrode 11, the ring electrode 12, the grid electrode 13, and the mask 30 of thin film fabricating apparatus according to one exemplary embodiment, and the electric fields generated in the electrode part 10 of the thin film fabricating apparatus, will now be described in more detail.

The thin film fabricating apparatus according to the illustrated exemplary embodiment is an electrostatic deposition (hereinafter also referred to as ESD) device using Rayleigh instability. The Rayleigh instability refers to a phenomenon that an electrostatic repulsive-force due to a surface charge prevents a liquid surface from being reduced by surface tension when the liquid surface is electrified (refer to L. Rayleigh: Phil. Mag., 14(1882) 184). When the repulsive force due to the electrified surface charge is stronger than the surface tension, the liquid is divided to discharge very tiny liquid droplets accompanied with an electric charge. In addition, ESD refers to a thin film coating method of applying a high voltage to the terminal end of a needle electrode to discharge very tiny liquid droplets and depositing the same on the subject substrate.

When applying a high voltage to the cylindrical needle, the Rayleigh instability occurs at the terminal end of the needle. In other words, the charge generating a high voltage stays on the surface to generate a stronger electrostatic repulsive force than the surface tension forming a curvature of the liquid at the terminal end of the needle, then the liquid surface is changed from a protruding shape to a concave shape at the needle end. As the results, the concave terminal end becomes a cone referred to as a Taylor cone, and very tiny liquid droplets are discharged from the top of the Taylor cone, which is referred to as electrospraying (refer to A. Jaworek, A. T. Sobczyk, "Electrospraying route to nanotechnology: An overview", Journal of Electrostatics 66 (2008) p 197-219). The discharged liquid droplets may be sprayed at about 1 μm to 7 μm when using appropriate conditions and the measurement method (refer to P.164L: Late-News Poster: The Study of Film Formation Process by Using an Electrospray Method to Manufacture High-Productivity OLED Devices Yoshiyuki Seike, Asahi Sunac Corporation, Aichi, Japan).

As the spayed liquid droplets having a micrometer size have a very large specific surface area, the spayed liquid droplets are dried at a high speed. Accordingly, the surface area of liquid droplets is decreased while maintaining the charge during the drying, so the charge density is increased according to the drying to enhance the electrostatic repulsive force and to repeat the pulverization. However, at less than or equal to about 1 μm, it loses a charge by the corona discharge due to the strong electric field generated by the surface charge, so that it is not further divided. When the liquid droplet includes a solid, all liquid droplets are evaporated to provide a solid particulate.

A process of attaching and depositing particulates provided by the above method on a face such as a substrate to provide a layer is also referred to as ESD. Using the ESD, a nano-unit thin film may be provided. As liquid is evaporated on the deposition, liquid is not smeared to an adjacent layer when a plurality of layers is provided with liquids having the different compositions through ESD, so it is a very promising method of coating a low molecular material for fabricating an organic light emitting device.

A needle voltage (Vp) is applied to a plurality of needle electrodes 11 in the thin film fabricating apparatus according to one exemplary embodiment shown in FIG. 1. A needle voltage (Vp) is a voltage in a region where a corona discharge is generated by applying a DC voltage to the terminal end of a sharp needle electrode 11, and the needle voltage (Vp) may be, for example, greater than or equal to about 500 V, for example, greater than or equal to about 500 V and less than or equal to about 50,000 V, or for example, greater than or equal to about 500 V and less than or equal to about 20,000 V. When the needle voltage (Vp) is within the range, liquid droplets 3, which are repeatedly pulverized, may not be further divided by evaporating the solvent thereof according to the corona discharge and may be dispersed as spray particles 4 which are solid particulates.

It is preferable to dispose the needle electrode on the center axis of the ring electrode 12 adjacent to the needle electrode 11, but it is not a concern to generate an abnormal discharge even when there is a deviation from the center axis.

The ring electrode 12 may control the dispersion direction of dispersed spray particles 4 and liquid droplets 3 discharged by the needle electrode 11. A ring voltage (Vr) may be applied to the ring electrode 12, and the ring voltage (Vr) is a voltage in the region where corona discharge is generated by applying a direct current ("DC") voltage. In an exemplary embodiment, the ring voltage (Vr) may be, for example, greater than or equal to about 500 V, for example, greater than or equal to about 500 V and less than or equal to about 50,000 V, or for example, greater than or equal to about 500 V and less than or equal to about 20,000 V. When the ring voltage (Vr) is within the range, the electrostatic spray may be made more effectively as the electric field may be concentrated on the terminal end of the needle electrode 11.

The spray particles 4 in which the dispersion direction is controlled by the ring electrode 12 may be moved toward the grid electrode 13. The grid electrode 13 may be applied with grid voltage (Vg), and the grid voltage (Vg) is a voltage in the region where the corona discharge is generated by applying a DC voltage. In an exemplary embodiment, the grid voltage (Vg) may be, for example, greater than or equal to about 500 V, for example, greater than or equal to about 500 V and less than or equal to about 50,000 V, or for example, greater than or equal to about 500 V and less than or equal to about 20,000 V. When the grid voltage (Vg) is within the range, the remaining liquid droplets 3, which pass through the grid electrode 13 and move toward the mask 30, may not be further divided and may be dispersed to spray particles 4 which are solid particulates.

In the thin film fabricating apparatus according to one exemplary embodiment shown in FIG. 1, all polarities of the needle voltage (Vp), the ring voltage (Vr), and the grid voltage (Vg) may be controlled to have the same polarity as the spray particles 4. Thereby, the spay particles 4 may not be attached on the surface of the needle electrode 11, the ring electrode 12, or the grid electrode 13 and may be moved toward the mask 30.

In the thin film fabricating apparatus according to one exemplary embodiment shown in FIG. 1, the absolute value of the voltage applied to the electrode part 10 may have an order of the needle voltage (Vp)>the ring voltage (Vr)>the grid voltage (Vg). By providing the potential difference in this way, the spray particles 4 may be moved from the needle electrode 11 to the grid electrode 13 in the electrode part 10.

Hereinafter, a near field occurring in the substrate and the mask from the electrode part 10 of the thin film fabricating apparatus 100 according to one exemplary embodiment and an electrostatic shutter state in which the near field is changed to block the forming of a thin film 6 according to changing the mask voltage (Vm) will be described in detail.

Figure 5:
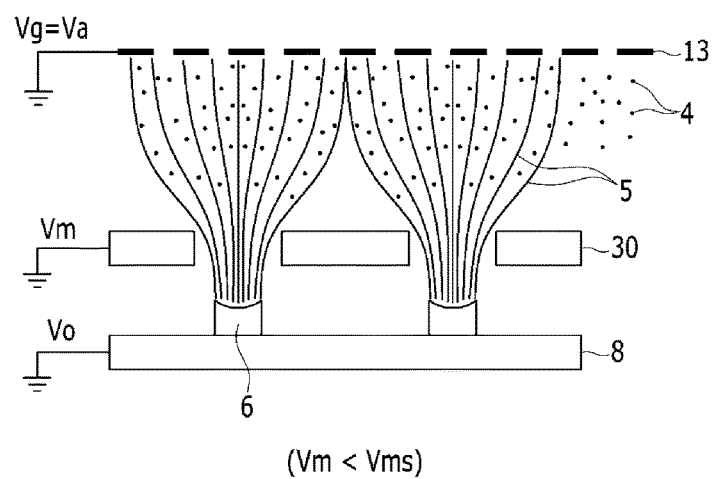
FIG. 5 shows a thin film fabricating apparatus including a near field of a thin film fabricating apparatus according to the embodiment shown in FIG. 1.
Figure 6:
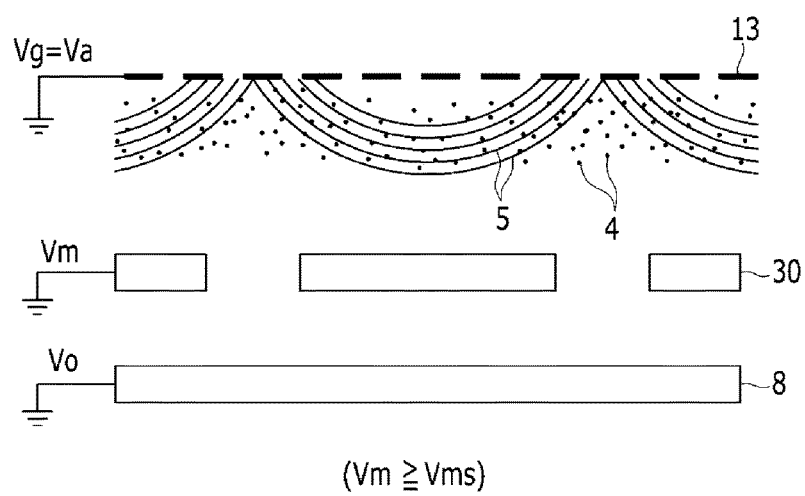
FIG. 6 shows a state that the forming a thin film is blocked in the thin film fabricating apparatus according to one exemplary embodiment shown in FIG. 1.

FIG. 5 shows the thin film fabricating apparatus including the near field according to one exemplary embodiment shown in FIG. 1, and FIG. 6 shows that the thin film formation is blocked in the thin film fabricating apparatus according to one exemplary embodiment shown in FIG. 1.

According to the illustrated exemplary embodiment, the near field is defined as an electric field passing through the pattern groove from the electrode part 10 electrode nearest to the mask to the substrate 8, and the near field includes a plurality of lines of electric force 5 corresponding to the moving path of spray particles as shown in FIGS. 5 and 6.

The spray particles 4 having passed through the grid electrode 13 pass the pattern groove of the mask 30 and are attached to the substrate 8 to provide the thin film 6, and the grid electrode 13 forms a near field with the mask 30 and the substrate 8.

The thin film fabricating apparatus according to one exemplary embodiment shown in FIG. 1 may satisfy an inequation, i.e., grid voltage (Vg)>mask voltage (Vm)>substrate voltage (V0), to move the spray particles 4 along the lines of electric force 5.

According to one exemplary embodiment shown in FIG. 1, the near electric field is affected by each magnitude of the grid voltage (Vg), the mask voltage (Vm), and the substrate voltage (V0). The needle voltage (Vp) and the ring voltage (Vr) other than the grid voltage (Vg) have little effect on the near field.

Thus, as the voltage of the grid electrode 13 of the electrode part 10 nearest to the mask 30 governs the flow of the near field including lines of electrostatic force 5 in FIG. 1, for example, the electrode governing the flow of the near field including lines of electrostatic force 5 is defined as a "dominant electrode," and the voltage applied to the dominant electrode is defined as a "dominant voltage (Va)."

That is, the grid electrode 13 is a dominant electrode in FIG. 1, and the grid voltage (Vg) is a dominant voltage (Va).

However, the scope of the invention is not limited thereto, and as shown in FIG. 2, when the electrode nearest to the mask 30 is a ring electrode 12, the ring electrode 12 may be the dominant electrode, and the ring voltage (Vr) may be the dominant voltage (Va), and even when the electrode part 10' does not include the ring electrode as shown in FIG. 3, the grid electrode 13 is the electrode nearest to the mask 30, so the grid electrode 13 may be the dominant electrode, and the grid voltage (Vg) may be the dominant voltage (Va), while as shown in FIG. 4, when the needle electrode 11 is the electrode nearest to the mask 30, the needle electrode 11 may be the dominant electrode, and the needle voltage (Vp) may be the dominant voltage (Va).

The near field may be changed to have the different shape by changing the mask voltage (Vm). In other words, the line of electrostatic force 5 may be extended from the grid electrode 13, which is the dominant electrode, to the substrate 8, as shown in FIG. 5, and the line of electrostatic force 5 may not be extended to the mask 30 or the substrate 8 and may be provided between the grid electrode 13, which is the dominant electrode, and the mask 30, as shown in FIG. 6.

In the case of FIG. 5, the spray particles 4 pass the pattern groove of the mask 30 and the grid electrode 13 and are attached on the substrate 8 to provide a thin film 6. But in the case of FIG. 6, the spray particles 4 stay in the space between the grid electrode 13 and the mask 30, so as to block the forming of a thin film 6. That is, when the mask voltage (Vm) is greater than or equal to the certain voltage in the near field, the forming of the thin film 6 may be blocked, as shown in FIG. 6.

According to the invention, a shutter voltage (Vms) is defined by the mask voltage (Vm) in the state in which the forming of a thin film 6 is blocked, that is, a thin film is not disposed on the surface of the substrate 8, as shown in FIG. 6, and an electrostatic shutter state is defined by the state in which the forming of a thin film 6 is blocked by applying a voltage greater than or equal to the shutter voltage (Vms).

The shutter voltage (Vms) satisfies Equation 1:

$$Vms = V0 + 1.07 \times 10^{-8} \times \frac{Va}{L \times CL^{1.2}} \qquad \text{[Equation 1]}$$

where L refers to the shortest distance between the mask 30 and the electrode part 10 electrode which is the shortest distance between the mask 30 and the dominant electrode, and CL refers to the shortest distance between the substrate 8 and the mask 30.

In other words, the shutter voltage (Vms) is proportional to the substrate voltage (V0) and the dominant voltage (Va) but inversely proportional to each of the shortest distance (L) between the dominant electrode and the mask and the shortest distance (CL) between the substrate and the mask.

According to one exemplary embodiment, the shortest distance (L) between the dominant electrode and the mask 30 may be, for example, about 0.005 meter (m) to about 0.3 m, for example, about 0.005 m to about 0.1 m. When the shortest distance (L) between the dominant electrode and the mask 30 is within the range, the space is sufficient to provide the near field between the dominant electrode and the mask 30, so that the near field may be provided as shown in FIG. 6 when the voltage greater than or equal to the shutter voltage (Vm) (Vm≥Vms) is applied to the mask 30.

According to one exemplary embodiment, the shortest distance (CL) between the substrate 8 and the mask 30 may be, for example, about 30 μm to about 3 mm, for example, about 30 μm to about 1 mm. When the shortest distance (CL) between the substrate 8 and the mask 30 is within the range, the substrate 8 and the mask 30 are appropriately spaced apart from each other to provide a high-definition thin film 6 and to maintain the potential difference between the substrate voltage (V0) applied to the substrate 8 and the mask voltage (Vm) applied to the mask 30, thereby preventing the phenomenon that the thin film material is attached to the surface of the mask 30.

The absolute value of the dominant voltage (Va) may be adjusted to be higher than the absolute value of the shutter voltage (Vms).

When the absolute value of the shutter voltage (Vms) is greater than or equal to the dominant voltage (Va), the line of electric force 5 is provided near the dominant electrode not near the mask 30 to move the spray particles 4 from the mask 30 toward the dominant electrode, so that a delay time occurs until the near field for providing a thin film 6 is provided when the mask voltage (Vm) is returned to the voltage capable of providing a thin film 6.

That is, by adjusting the absolute value of the dominant voltage (Va) to be greater than the absolute value of the shutter voltage (Vms), it may maintain a steady state making the movement direction of spray particles 4 from the dominant electrode to the mask 30, so as to provide a thin film without the delay time even when the mask voltage (Vm) is returned to the voltage capable of providing a thin film 6.

According to one exemplary embodiment, the absolute value of the dominant voltage (Va) may be, for example, greater than or equal to about 500 V, for example, greater than or equal to about 500 V and less than or equal to about 50,000 V, or for example, greater than or equal to about 500 V and less than or equal to about 20,000 V. When the absolute value of the dominant voltage (Va) is within the range, it is easy to maintain the near field between the dominant voltage (Va) and the mask voltage (Vm) to be steady state.

According to one exemplary embodiment, the absolute value of shutter voltage (Vms) may be, for example, about 1.5 V to about 100 V, or for example, about 5 V to about 50 V. When the absolute value of shutter voltage (Vms) is within the range, it may stably prevent the spray particles 4 from being suspended in the substrate 8 side.

The thin film fabricating apparatus 100 according to one exemplary embodiment satisfies the relationship shown in Inequation 2.

$$\frac{(Vms - V0)}{Va} > 0 \qquad \text{[Inequation 2]}$$

That is, the potential difference between the shutter voltage (Vms) and the substrate voltage (V0) has the same polarity as the dominant voltage (Va) and the spray particles 4.

When the shutter voltage (Vms) has a different polarity from the dominant voltage (Va) and the spray particles 4, the spray particles 4 are unfavorably attached to the mask 30 instead of the substrate 8. However, when the shutter voltage (Vms) has the same polarity as the dominant voltage (Va) and the spray particles 4, the lines of electric force 5 may be provided by the repulsive force between the spray particles 4 and the mask 30, as shown in FIG. 6.

In Inequation 2, the potential of the substrate voltage (V0) may generally be the ground potential, in order to more actively attach the spray particles 4 onto the substrate, and the absolute value of the substrate voltage (V0) may have a weak potential, for example, a potential of greater than 0 V and less than or equal to about 100 V, while having the opposite polarity to the electrification of the spray particles 4. Thereby, the potential difference from the shutter voltage (Vms) according to changing a substrate voltage (V0) may be adjusted to be greater than 0 V.

In this way, when the near field is controlled to prevent the forming of a thin film 6 by adjusting the mask voltage (Vm), the substrate 8 may be easily replaced while maintaining the mask voltage (Vm) at greater than or equal to the shutter voltage (Vms) without the additional physical shutter, for example, when the thin film 6 is provided by the sheetfed method.

In addition, the electrostatic shutter state is directly produced by applying a voltage to the mask 30 at greater than or equal to the shutter voltage (Vms), so the process waiting time for disposing the shutter is not required, and the forming of a high-definition thin film 6 may be controlled compared to the physical shutter since it may change the near field.

That is, one exemplary embodiment may provide a thin film fabricating apparatus 100 having high efficiency in mass production and being capable of providing a high-definition thin film, compared to the conventional thin film fabricating apparatus including a physical shutter.

Hereinafter, will be described in detailed whether the shutter voltage (Vms) of thin film fabricating apparatus 100 according to one exemplary embodiment satisfies Equation 1 and Inequation 2 will be described in detail, based on the following experimental examples.

FIG. 7 is a graph showing a correlation of a dominant voltage (Va) and a shutter voltage (Vms) according to a distance when the shortest distance (CL) between the mask and the substrate is each of 50 μm, 100 μm, and 200 μm.

Experiment 1: Comparing Shutter Voltage Calculated by Charge Simulation MethodCharge Simulation Method to Equation 1

A near electric field change is calculated by changing the dominant voltage (Va) in each of 500 V, 1000 V, 2500 V, and 5000 V in the thin film fabricating apparatus 100 having a pattern groove interval of a mask 30 of 300 μm, a pattern groove diameter of a mask 30 of 140 μm, a substrate voltage (V0) of 0 V which is a ground potential, the shortest distance (L) between the dominant electrode and the mask 30 of 0.1 m, and the shortest distance (CL) between the substrate 8 and the mask 30 of 50 μm, as the thin film fabricating apparatus 100 shown in FIG. 1. The near field change is calculated by the charge simulation methodcharge simulation method which is a numerical analysis using uniqueness of charge and potential distribution. The value (Vms1) of the shutter voltage calculated by the charge simulation method is shown in the following Table 1 and marked in circles in FIG. 7. In addition, each condition is substituted to Equation 1, the value (Vms2) of the shutter voltage calculated by Equation 1 is shown in Table 1, and the tendency thereof is shown as a solid line of FIG. 7.

Then it is disposed to provide the shortest distance (CL) between the substrate 8 and the mask 30 of 100 μm, and the experiments are repeated. The value (Vms1) of the shutter voltage calculated by the charge simulation method is shown in Table 1 and marked as triangles in FIG. 7. In addition, the value (Vms2) of the shutter voltage calculated by substituting each condition to Equation 1 is shown in the following Table 1, and the tendency is shown as a dotted line in FIG. 7.

Then the value (Vms1) of the shutter voltage is calculated by the same charge simulation method, except the shortest distance (CL) between the substrate 8 and the mask 30 is 200 μm, and the results are shown in Table 1 and marked as squares in FIG. 7. In addition, the value (Vms2) of the shutter voltage calculated by substituting each condition in Equation 1 is shown in the following Table 1, and the tendency is shown as a one-point chain line in FIG. 7.

TABLE 1

| dominant voltage (Va) | Shutter voltage (Vms) | | | | | |
|---|---|---|---|---|---|---|
| | CL = 50 μm | | CL = 100 μm | | CL = 200 μm | |
| | Vms1 | Vms2 | Vms1 | Vms2 | Vms1 | Vms2 |
| 500 (V) | 8.0 (V) | 7.8 (V) | 3.3 (V) | 3.4 (V) | 1.5 (V) | 1.5 (V) |
| 1000 (V) | 16.0 (V) | 15.5 (V) | 6.7 (V) | 6.8 (V) | 3.0 (V) | 2.9 (V) |
| 2500 (V) | 40.0 (V) | 38.8 (V) | 16.7 (V) | 16.9 (V) | 7.0 (V) | 7.3 (V) |
| 5000 (V) | 80.0 (V) | 77.6 (V) | 33.0 (V) | 33.8 (V) | 14.0 (V) | 14.7 (V) |

Figure 7:
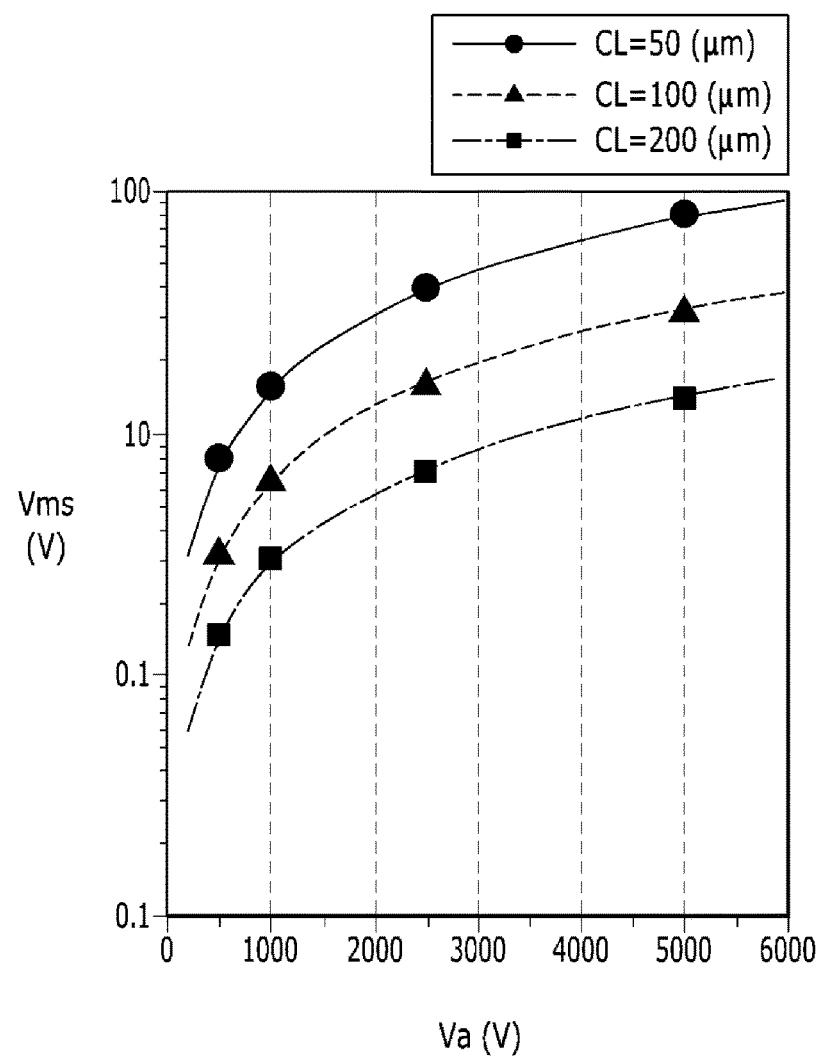
FIG. 7 is a graph showing a correlation between a dominant voltage and a shutter voltage according to a distance when the shortest distance (CL) between the mask and the substrate is 50 micrometers ($\mu m$), 100 $\mu m$, and 200 $\mu m$, respectively.

Referring to Table 1, it is understood that as the magnitude of the dominant voltage (Va) is increased, the magnitude of the shutter voltage (Vms) is gradually increased, and as the shortest distance (CL) between the substrate 8 and the mask 30 is increased, the shutter voltage (Vms) tends to be decreased. In addition, it is confirmed that Vms1 and Vms2 tend to correspond to each other, even with a small error, with reference to Table 1 and FIG. 7.

In other words, it is confirmed that the shutter voltage (Vms) of the thin film fabricating apparatus 100 according to one exemplary embodiment satisfies Equation 1.

Experiment 2: Verifying Inequation 2 by Measuring Shutter Voltage, Dominant Voltage, and Substrate Voltage As the thin film fabricating apparatus 100 shown in FIG. 1, the thin film fabricating apparatus 100 is designed to have a pattern groove interval of a mask 30 of 300 μm, a pattern groove diameter of a mask 30 of 140 μm, a shortest distance (L) between the dominant electrode and the mask 30 of 0.1 m, and a shortest distance (CL) between the substrate 8 and the mask 30 of 100 μm. Providing the mask voltage (Vm) with either one of ±30 V, the substrate voltage (V0) as any one of 0 V, ±5 V, and ±30 V, and the dominant voltage (Va) as ±5000 V, five cases satisfying the conditions of Inequation 2 are designated as Experimental Example 1 to Experimental Example 5, respectively, and the results are shown in the following Table 2.

Thereafter, Comparative Example 1 is provided under the same conditions as in Experimental Example 2 except for applying the mask voltage (Vm) of +10 V, the substrate voltage (V0) of +15 V, and the dominant voltage (Va) of +5000 V, and Comparative Example 2 is provided under the same conditions as in Experimental Example 2 except for applying the mask voltage (Vm) of −30 V, the substrate voltage (V0) of −50 V, and the dominant voltage (Va) of −5000 V, and the results are shown in the following Table 2.

the mask 30. On the contrary, it is understood that the cases of Experimental Example 1 to Experimental Example 5, which satisfy Inequation 2, form a thin film 6 only on the surface of the substrate 8.

In all of Comparative Examples 1 and 2 and Experimental Examples 1 to 5, the mask voltage (Vm), the dominant voltage (Va), and spray particles 4 have the same polarity.

However, the cases of Comparative Example 1 and Comparative Example 2 have a potential difference between the mask voltage (Vm) and the substrate voltage (V0) of less than 0 V, causing the electrostatic repellent force between the spray particles 4 and the substrate voltage (V0), so that the expelled spray particles 4 are attached to the surface of the mask 30 to provide a thin film 6.

The cases of Experimental Example 1 to Experimental Example 5 have a potential difference between the mask voltage (Vm) and the substrate voltage (V0) of greater than 0 V, so that spray particles 4 are induced and attached to the substrate 8 through the mask 30 to provide a thin film 6 on the surface of the substrate 8.

In other words, it is confirmed that the thin film fabricating apparatus 100 according to one exemplary embodiment satisfies Inequation 2, so as to easily provide a thin film 6 on the surface of the substrate 8.

The thickness irregularity of the obtained thin film 6 according to a minute change of mask voltage (Vm) and the near field generated in the mask 30 and the substrate 8 from the electrode part 10 of the thin film fabricating apparatus according to one exemplary embodiment will be described.

According to one exemplary embodiment, an aging time is defined as a time of attaching spray particles 4 on the surface of the substrate 8 to provide a thin film 6 along with a line of electric force 5 when the mask voltage (Vm) is less than the shutter voltage (Vms).

Figure 8:
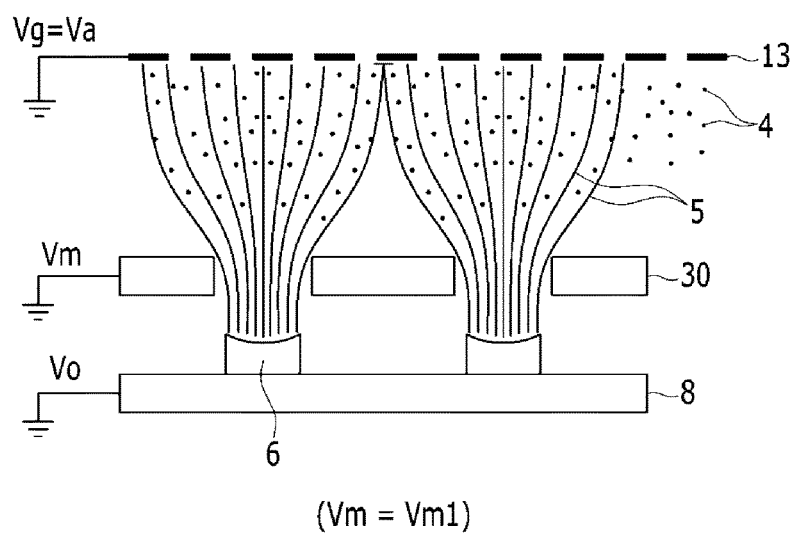
FIG. 8 shows a case of applying only a first voltage to a mask for the aging time in the thin film forming process using the thin film fabricating apparatus according to one exemplary embodiment shown in FIG. 1.
Figure 9:
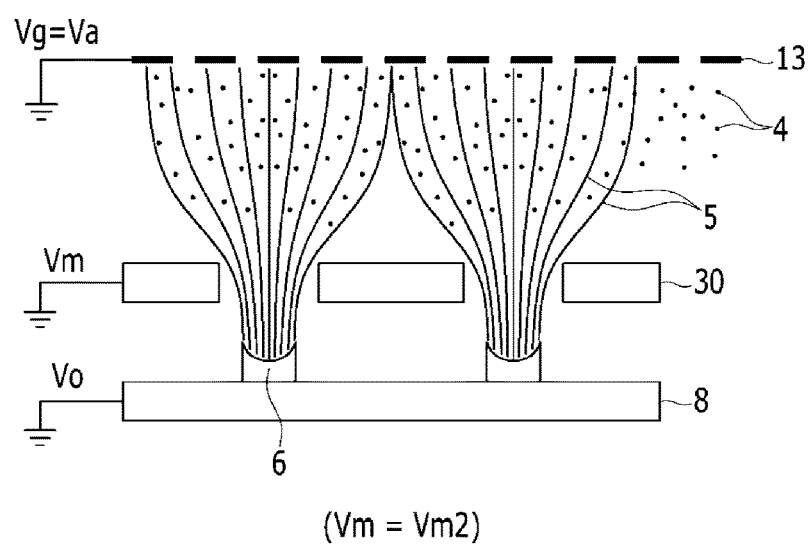
FIG. 9 shows a case of applying a second voltage greater than the first voltage to a mask for the aging time in the thin film forming process using the thin film fabricating apparatus according to one exemplary embodiment shown in FIG. 1, FIGS. 10A to 12B show how uniform a thickness the obtained thin film has when applying a mask voltage of 9 V (refer to FIGS. 10A and 10B), 11 V (refer to FIGS. 11A and 11B), and 15 V (refer to FIGS. 12A and 12B), respectively, in the thin film forming process using the thin film fabricating apparatus according to the embodiment shown in FIG. 1.

FIG. 8 shows the case of applying only the first voltage (Vm1) to the mask for the aging time during the thin film forming process using the thin film fabricating apparatus according to the embodiment shown in FIG. 1, and FIG. 9 shows the case of applying the second voltage (Vm2) that is higher than the first voltage (Vm1) onto the mask for the aging time during the thin film forming process using a thin film fabricating apparatus according to the embodiment shown in FIG. 1. In the illustrated exemplary embodiment, both the first voltage (Vm1) and the second voltage (Vm2) are less than the shutter voltage (Vms), so as to provide a thin film on the substrate 8.

When the first voltage (Vm1) is applied to the mask 30, lines of electric force 5 of the near field are passed through a pattern groove of the mask 30 from the grid electrode 13

TABLE 2

| | Comparative Example1 | Comparative Example2 | Experimental Example 1 | Experimental Example 2 | Experimental Example 3 | Experimental Example 4 | Experimental Example 5 |
|---|---|---|---|---|---|---|---|
| Vm (V) | +10 | −30 | +30 | +30 | +30 | −30 | −30 |
| V0 (V) | +15 | −50 | 0 | −5 | +5 | +50 | −10 |
| Va (V) | +5000 | −5000 | +5000 | +5000 | +5000 | −5000 | −5000 |
| (Vm−V0)/Va | −0.001 < 0 | −0.004 < 0 | +0.006 > 0 | +0.007 > 0 | +0.005 > 0 | +0.016 > 0 | +0.004 > 0 |
| Thin film forming position | Mask surface | Mask surface | Substrate surface | Substrate surface | Substrate surface | Substrate surface | Substrate surface |

Referring to Table 2, it is understood that the cases of Comparative Example 1 and Comparative Example 2, which do not satisfy Inequation 2, form thin films 6 on surface of and extended to the surface of the substrate 8, as shown in FIG. 8. As the potential difference between the mask voltage (Vm) and the substrate voltage (V0) is controlled to not be 0 V, and as the mask voltage (Vm) and the spray particles 4 are controlled to have the same polarity and to be repulsive to each other, the spray particles 4 are not attached to the surface of the mask 30 and are moved along the line of electric force 5 to be attached the surface of the substrate 8, so as to provide a thin film 6.

When the first voltage (Vm1) is applied to the mask 30, the spray particles 4 distributed around the mask 30 are nearer to the substrate 8 than the spray particles distributed around the grid electrode 13, so that they are not uniformly distributed along each line of electric force 5 and are moved in a concentrated form on the outermost side among the lines of electric force 5. Thereby, the thin film 6 has a shape of protruding a both sides as shown in FIG. 8.

When the second voltage (Vm2) that is higher than the first voltage (Vm1) is applied to the mask 30, a thin film 6 having further protruding sides compared to that shown in FIG. 8 is provided as shown in FIG. 9.

In other words, according to FIGS. 8 and 9, when continuously applying the same mask voltage (Vm), the thin film 6 having an irregular thickness is provided, and the irregularity of the thickness of the thin film 6 may be caused by the position of spray particles 4 distributed in the near field, how the mask 30 voltage is applied, and the moving path of spray particles 4.

Hereinafter, the shape difference of an obtained thin film when only one kind of mask voltage (Vm) is applied in different magnitudes for the aging time in the thin film fabricating apparatus 100 according to one exemplary embodiment will be described in detail, with reference to the following experimental examples.

Figure 15:
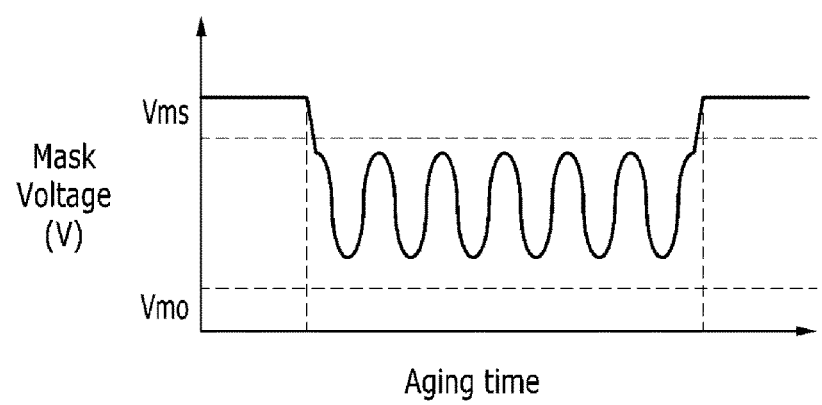
Figure 16:
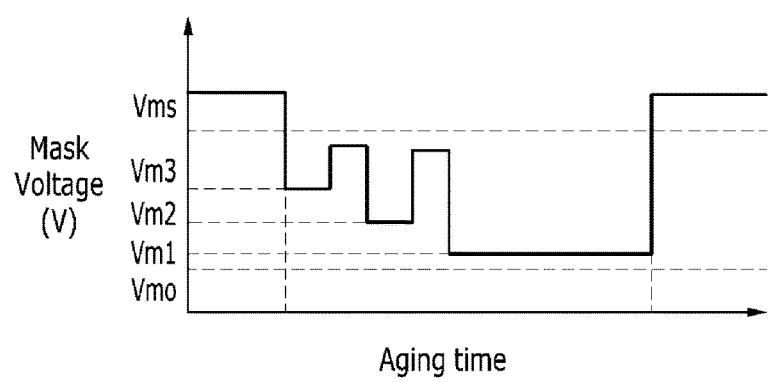
Figure 17:
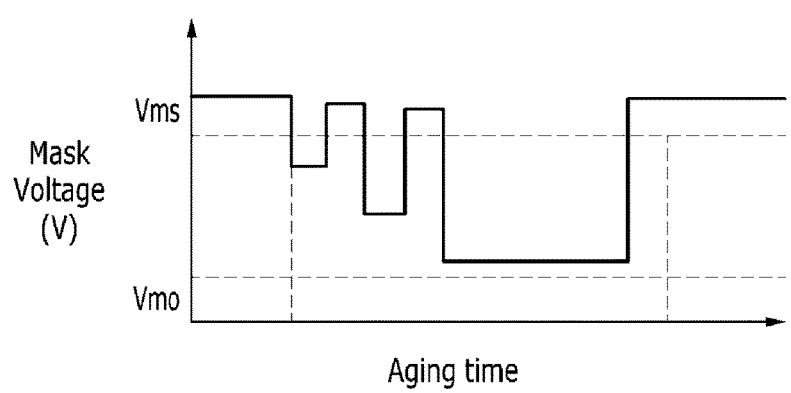
Figure 18:
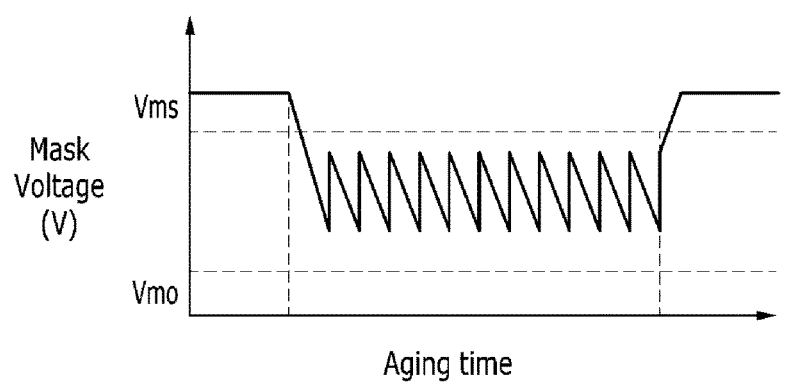
Figure 19:
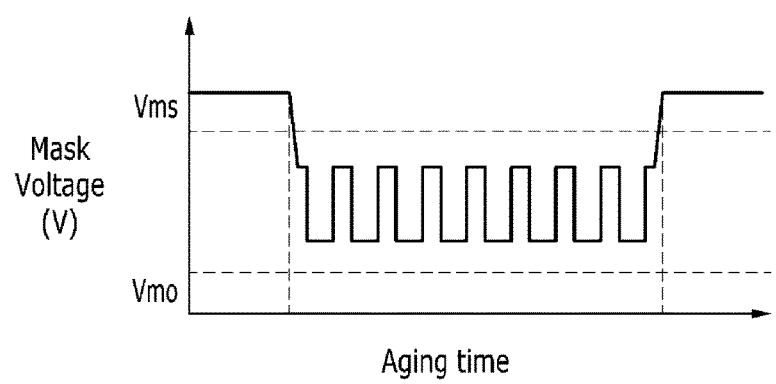

Experiment 3: Measuring Thin Film Shape Change when Only Mask Voltage Having Constant Value with Changing Magnitude is Applied FIGS. 10A to 12B show how uniform the thickness of thin film is when applying mask voltage (Vm) of 9 V in FIGS. 10A and 10B, 11 V in FIGS. 11A and 11B, and 15 V in FIGS. 12A and 12B during a thin film forming process using a thin film fabricating apparatus according to one exemplary embodiment shown in FIG. 1.

Figure 10A:
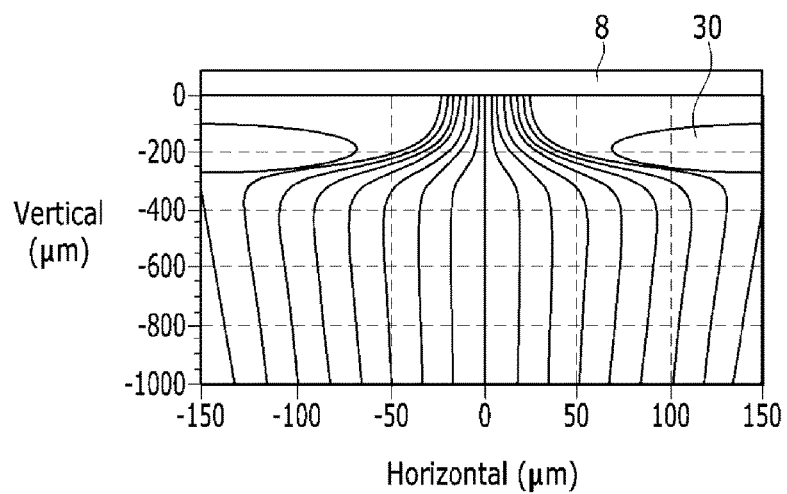
Figure 10B:
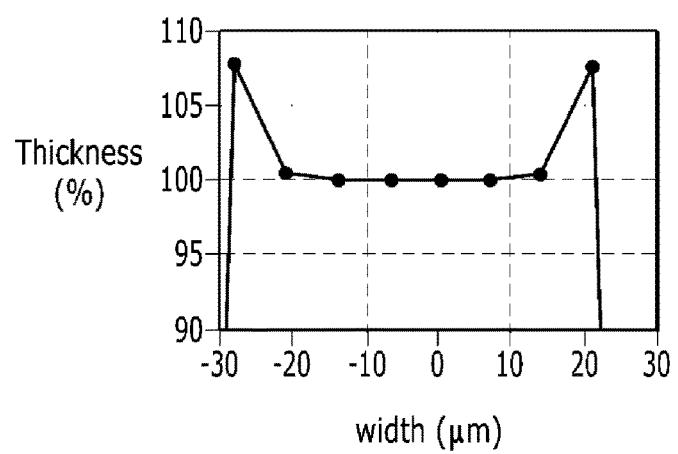
Figure 11A:
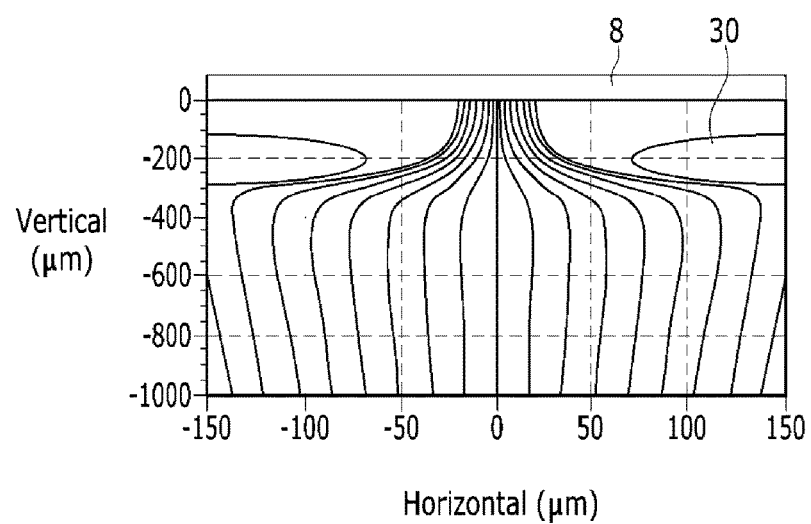
Figure 11B:
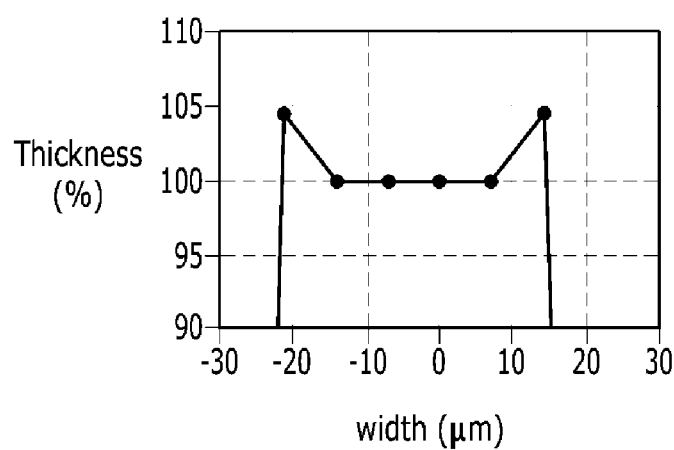
Figure 12A:
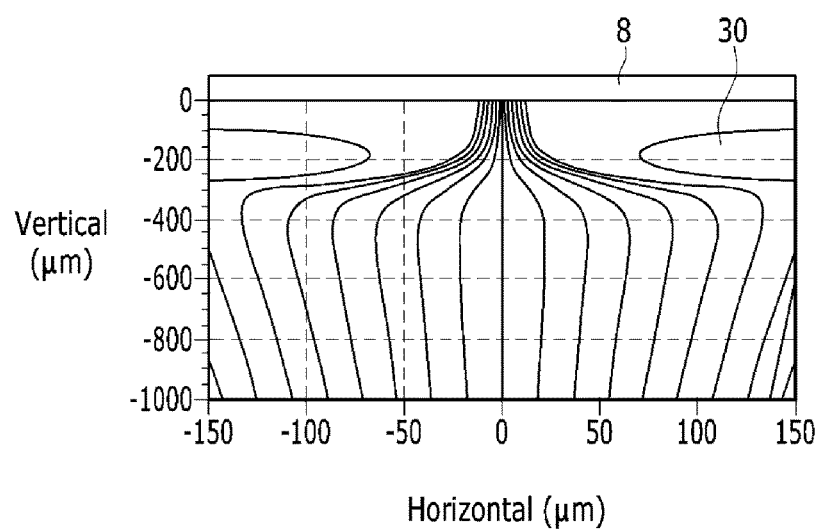
Figure 12B:
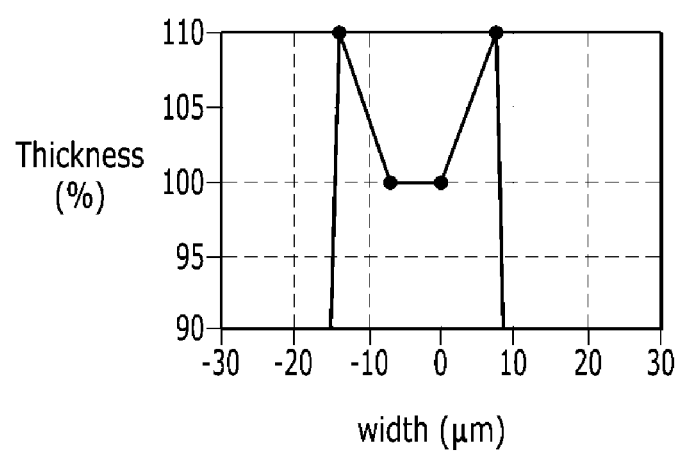

FIGS. 10A, 11A and 12A correspond to drawings showing the insides of a thin film fabricating apparatus provided with the near electric field, and FIGS. 10B, 11B and 12B are graphs showing the widths and the thicknesses of the obtained thin films.

The graphs shown in FIGS. 10B, 11B and 12B indicate a width of thin film 6 in a unit of μm unit and a thickness in a unit of percent. By indicating the thickness of thin film 6 in percent, the deviation (4) between the point where the thickness of the thin film 6 is minimized and the point where it is maximized are easily found.

The dominant voltage (Va) of 5000 V is applied to the thin film fabricating apparatus 100 in which the pattern groove diameter is 140 μm, the pattern groove interval is 300 μm, the shortest distance (L) between the dominant electrode and the mask 30 is 0.1 m, the shortest distance (CL) between the substrate 8 and the mask 30 is 100 μm for the aging time, and the mask voltage (Vm) of the constant voltage of each of 9 V, 11 V, and 15 V is applied thereto, as shown in FIGS. 10A, 11A and 12A, and the results are shown in FIGS. 10B, 11B and 12B.

Referring to FIGS. 10B, 11B and 12B, it is confirmed that the width of the thin film 6 becomes narrower from about 50 μm in FIG. 10B, to about 37 μm in FIG. 11B, and about 24 μm in FIG. 12B. This is because the repulsive force between the mask 30 and the spray particles 4 is easily found stronger when applying the higher voltage as the mask voltage (Vm) to make the interval between the lines of electric force 5 narrower, so that the thin film 6 is provided to be concentrated toward a certain position, for example, the position corresponding to about −5 μm among the width coordinate of the thin film 6 in FIGS. 10B to 12B.

The maximum thickness of the thin film 6 compared to the minimum thickness is 47.6 percent (%), which is 107.6% with respect to 100%, in FIG. 10B, but in the case of FIG. 11B, it is slightly decreased to 44.6%, which is 104.6% with respect to 100%, and in the case of FIG. 12B, it is significantly increased to 49.8%, which is 109.8% with respect to 100%. The reason for the decreasing ratio of FIG. 11B with respect to FIG. 10B is because the moving path of spray particles 4 is increased according to the mask voltage change, and the reason for the rapidly increasing ratio of FIG. 12B with respect to FIG. 11B is because the forming width reduction of a thin film 6 according to applying a high voltage and the moving speed of spray particles 4 have more influence than the lengthened moving path of the spray particles 4.

As described above, when different voltages are constantly applied for the aging time, the near electric field is changed according to the applied voltage to provide the different thicknesses of thin films 6, respectively. In addition, as the lines of electric force 5 approaching the substrate 8 are more focused toward a certain one position, the width of the thin film 6 tends to be inversely proportional to the applied mask voltage (Vm).

Figure 13:
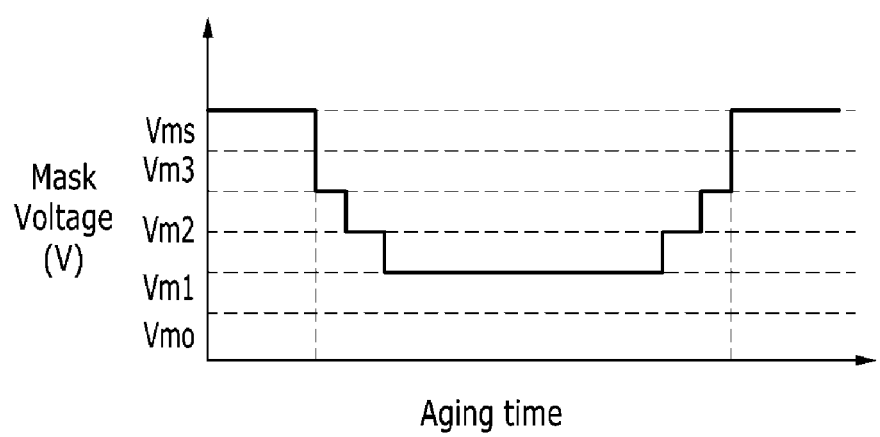
FIG. 13 shows a change of the mask voltage with respect to the aging time and how uniform a thickness the obtained thin film has when applying the voltage sequence including the first voltage, the second voltage, and the third voltage to the mask for the aging time in the thin film forming process using the thin film fabricating apparatus according to one exemplary embodiment shown in FIG. 1, FIGS. 14 to 19 show examples of various mask voltage waveforms of the thin film fabricating apparatus according to one exemplary embodiment shown in FIG. 1, and FIGS. 20 and 21 show thin film formats obtained by adjusting an applying rate of the first voltage to the third voltage according to the aging time in the thin film forming process using a thin film fabricating apparatus according to the embodiment shown in FIG. 13.
Figure 14:
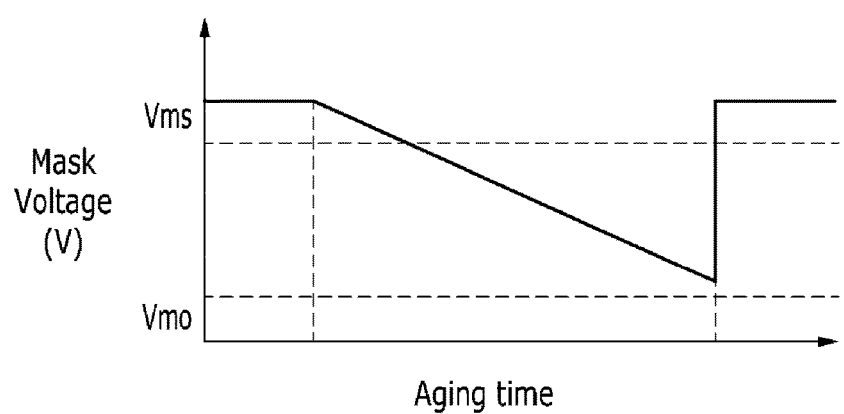

FIG. 13 shows the mask voltage (Vm) change to the aging time and the thickness uniformity of the completed thin film when applying the voltage sequence including the first voltage (Vm1), the second voltage (Vm2), and the third voltage (Vm3) having constant potentials to the mask for the aging time during the thin film forming process using the thin film fabricating apparatus according to one exemplary embodiment shown in FIG. 1.

FIG. 13 shows that, for convenience, the voltage sequence of the mask voltage (Vm) has a waveform when the third voltage (Vm3), the second voltage (Vm2), and the first voltage (Vm1) are sequentially applied, and then the second voltage (Vm2) and the third voltage (Vm3) are sequentially applied, but is not limited thereto. That is, the thickness uniformity of the thin film obtained according to the voltage sequence is not related to the order of applying the first voltage (Vm1), the second voltage (Vm2), and the third voltage (Vm3) in one exemplary embodiment.

The thin film fabricating apparatus 100 according to one exemplary embodiment provides a thin film fabricating apparatus 100 capable of minutely controlling a thickness of the thin film 6 by applying the voltage sequence including two or more voltages different from each other as the mask voltage (Vm) within the aging time, as shown in FIG. 13.

More specifically, a thin film having a relatively wide width is provided by applying the first voltage (Vm1) as shown in FIG. 10B, a thin film having a relatively narrow width is provided by applying the second voltage (Vm2) higher than the absolute value of the first voltage (Vm1) as shown in FIG. 11B, and a thin film having a very narrow width is provided by applying the third voltage (Vm3) higher than the absolute value of the first voltage (Vm1) and the second voltage (Vm2), as shown in FIG. 12B, so that the obtained thin film may have a relative uniform shape as shown in FIG. 12B.

All of the first voltage (Vm1) to the third voltage (Vm3) may be higher than the substrate voltage (V0). That is, when the mask voltage having the equivalent potential to the substrate voltage (V0) refers to the threshold voltage (Vm0), all of the first voltage (Vm1) to the third voltage (Vm3) have a magnitude that is greater than the threshold voltage (Vm0).

In other words, the thin film fabricating apparatus 100 according to one exemplary embodiment is applied with a mask voltage (Vm) in a voltage sequence including the first voltage (Vm1), the second voltage (Vm2), and the third voltage (Vm3) which are different from each other and have the constant potential for a predetermined time, thereby providing a thin film having a uniform thickness.

For the aging time, the absolute value of the mask voltage (Vm) may be changed, for example, from 1 V to 100 V, or for example, from 1.5 V to 50 V. That is, all absolute values of the first voltage (Vm1), the second voltage (Vm2), and the third voltage (Vm3) may be changed, for example, from 1 V to 100 V, or for example, from 1.5 V to 50 V.

When the mask voltage (Vm) is changed within the range for the aging time, the near electric field passing through the mask pattern groove from the dominant electrode to the substrate 8 may be provided, and the moving path of the micro-particles and the mask voltage (Vm) may be offset to enhance the thin film forming speed and the thin film forming efficiency.

The first voltage (Vm1) may be applied, for example, for greater than or equal to about 75% of the aging time of mask voltage (Vm), for example, 82% to 99%, or for example, 94% to 98%. When the ratio of the first voltage (Vm1) in the aging time is within the range, a thin film having a relatively wide thickness may be provided similarly to the pattern groove of the mask 30 by the relatively low voltage.

The second voltage (Vm2) may be applied, for example, for 1% to 20% of the aging time of the mask voltage (Vm), for example, 1% to 15%, or for example, 4% to 6%. When the ratio of the second voltage (Vm2) in the aging time is within the range, the thin film provided by the first voltage (Vm1) may be widely filled to minimize the thickness error of thin film.

The third voltage (Vm3) may be applied, for example, for less than or equal to about 5% of the aging time of mask voltage (Vm), for example, 0.1% to 5%, or for example, 1% to 5%. When the ratio of the third voltage (Vm3) in the aging time is within the range, the narrow region which was not filled by the first voltage (Vm1) and the second voltage (Vm2) may be intensively filled, so that the thickness error of thin film may be minimized.

However, the aging time of the first voltage (Vm1) to the third voltage (Vm3) is not necessarily limited to the range, and may be variously changed according to conditions such as the magnitudes of the dominant voltage (Va) or mask voltage (Vm), the shortest distance between the substrate 8 and the mask 30, the shortest distance between the mask 30 and the electrode part 10, the diameter of mask 30 pattern groove, and the like.

A voltage is applied to the mask voltage (Vm) at greater than or equal to the shutter voltage (Vms) for the time except the aging time, so as to block the forming of a thin film 6, thereby easily controlling the thickness of thin film in the whole process of the film fabricating method.

The voltage sequence applied to the mask voltage (Vm) may be controlled to provide a periodic waveform for at least the aging time, as shown in FIG. 13. That is, the first voltage, the second voltage, and the third voltage, which are greater than the threshold voltage (Vm0) and have the constant potential, may be controlled to be applied in a step waveform. When the mask voltage (Vm) is a periodic wave, the frequency may be variously controlled from the general power source frequency of 50 Hertz (Hz) to 60 Hz to a high frequency of 1 kHz, for example.

In this way, by controlling the sequence of the mask voltage (Vm) in a periodic waveform, the thickness of the thin film may be further precisely controlled, and the thin film forming process may be anticipated through the periodicity of the voltage, so that the error may be minimized and the thickness precision of thin film may be further enhanced.

However, the scope of the invention is not necessarily limited thereto, and the sequence of the mask voltage may have various periodic waveforms instead of a step waveform or may have an aperiodic waveform.

FIGS. 14 to 19 show waveform examples of the various mask voltages (Vm) of the thin film fabricating apparatus according to one exemplary embodiment shown in FIG. 1.

In other words, in the thin film fabricating apparatus 100 according to one exemplary embodiment, the waveform of the mask voltage (Vm) sequence applied for the aging time is not limited to the certain waveform as described above. In exemplary embodiments, the waveform of the mask voltage (Vm) sequence may be a taper-shaped aperiodic waveform (refer to FIG. 14), a sine waveform (refer to FIG. 15), an aperiodic waveform such as a step waveform (refer to FIG. 16), a step waveform including a voltage greater than or equal to the shutter voltage (Vms) (refer to FIG. 17), a sawtooth waveform (refer to FIG. 18), or a square waveform (refer to FIG. 19), for example.

In this way, the thin film fabricating apparatus 100 according to one exemplary embodiment may stably provide a thin film with a uniform thickness by applying a voltage sequence including at least two voltages having different magnitudes from each other, which are higher than the threshold voltage (Vm0), to the mask voltage (Vm) in the aging time.

Then when the thin film fabricating apparatus 100 according to one exemplary embodiment is applied with the mask voltage (Vm) having the voltage sequence shown in FIG. 13, how the thin film shape is changed according to the ratio of the first voltage (Vm1) to the third voltage (Vm3) in the aging time will be described in detail with reference to the following experiments.

Experiment 4: Shape Change of Thin Film According to Voltage Sequence Difference Applied to Mask Voltage A dominant voltage (Va) of 1000 V or 5000 V is applied for an aging time to a thin film fabricating apparatus 100 having a pattern groove diameter of 80μ or 140 μm, a pattern groove interval of 300 μm, a shortest distance (L) between a dominant electrode and a mask 30 of 0.1 m, a substrate voltage (V0) which is a ground voltage of 0 V, a shortest distance (CL) between the substrate 8 and the mask 30 of 50 μm or 100 μm, and a first voltage (Vm1) of 82% to 96%, a second voltage (Vm2) of 4% to 15%, and a third voltage (Vm3) of less than or equal to 5% are applied as a mask voltage (Vm) in the voltage sequence shown in FIG. 13, and the results are shown in Table 3 and Table 4.

TABLE 3

|  |  | Comparative Example 3 | Experimental Example 6 | Experimental Example 7 | Comparative Example 4 | Experimental Example 8 | Experimental Example 9 |
|---|---|---|---|---|---|---|---|
| V0 (V) |  | 0 | 0 | 0 | 0 | 0 | 0 |
| Va (V) |  | 5000 | 5000 | 5000 | 5000 | 5000 | 5000 |
| Pattern groove diameter (μm) |  | 140 | 140 | 140 | 80 | 80 | 80 |
| Pattern groove interval (μm) |  | 300 | 300 | 300 | 300 | 300 | 300 |
| CL (μm) |  | 100 | 100 | 100 | 100 | 100 | 100 |
| L (m) |  | 0.1 | 0.1 | 0.1 | 0.1 | 0.1 | 0.1 |
| Vm (V) | Vm1 | 9 | 9 | 9 | 18 | 18 | 18 |
|  | Vm2 | 11 | 11 | 11 | 22 | 22 | 22 |
|  | Vm3 | 15 | 15 | 15 | 25 | 25 | 25 |
| Ratio according to aging time (%) | R1 | 100 | 95 | 94.5 | 100 | 96 | 95.5 |
|  | R2 | 0 | 5 | 5 | 0 | 4 | 4 |
|  | R3 | 0 | 0 | 0.5 | 0 | 0 | 0.5 |
| Thin film width (μm) |  | 50 | 50 | 50 | 35 | 35 | 35 |
| Thin film thickness Δ (%) |  | 7.6 | 0.8 | 0.6 | 7.4 | 1.1 | 0.2 |

Figure 20:
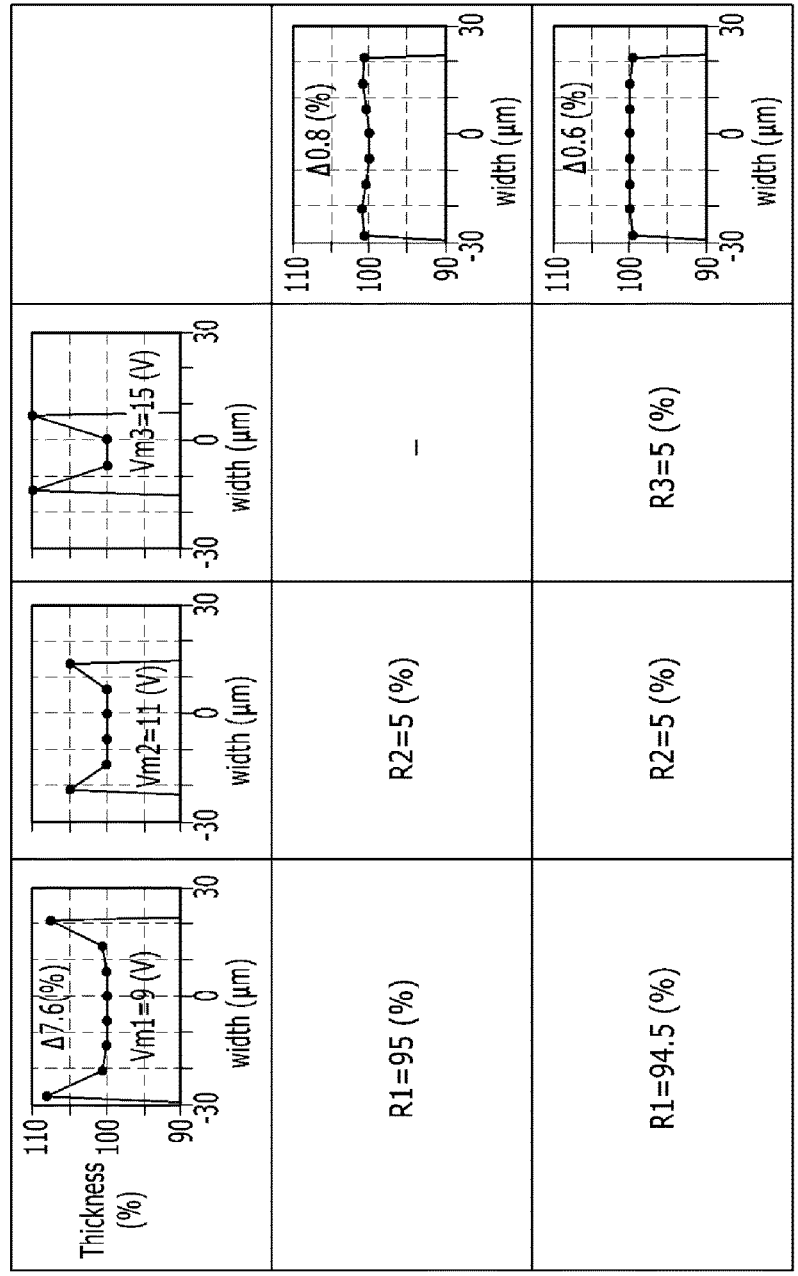
Figure 21:
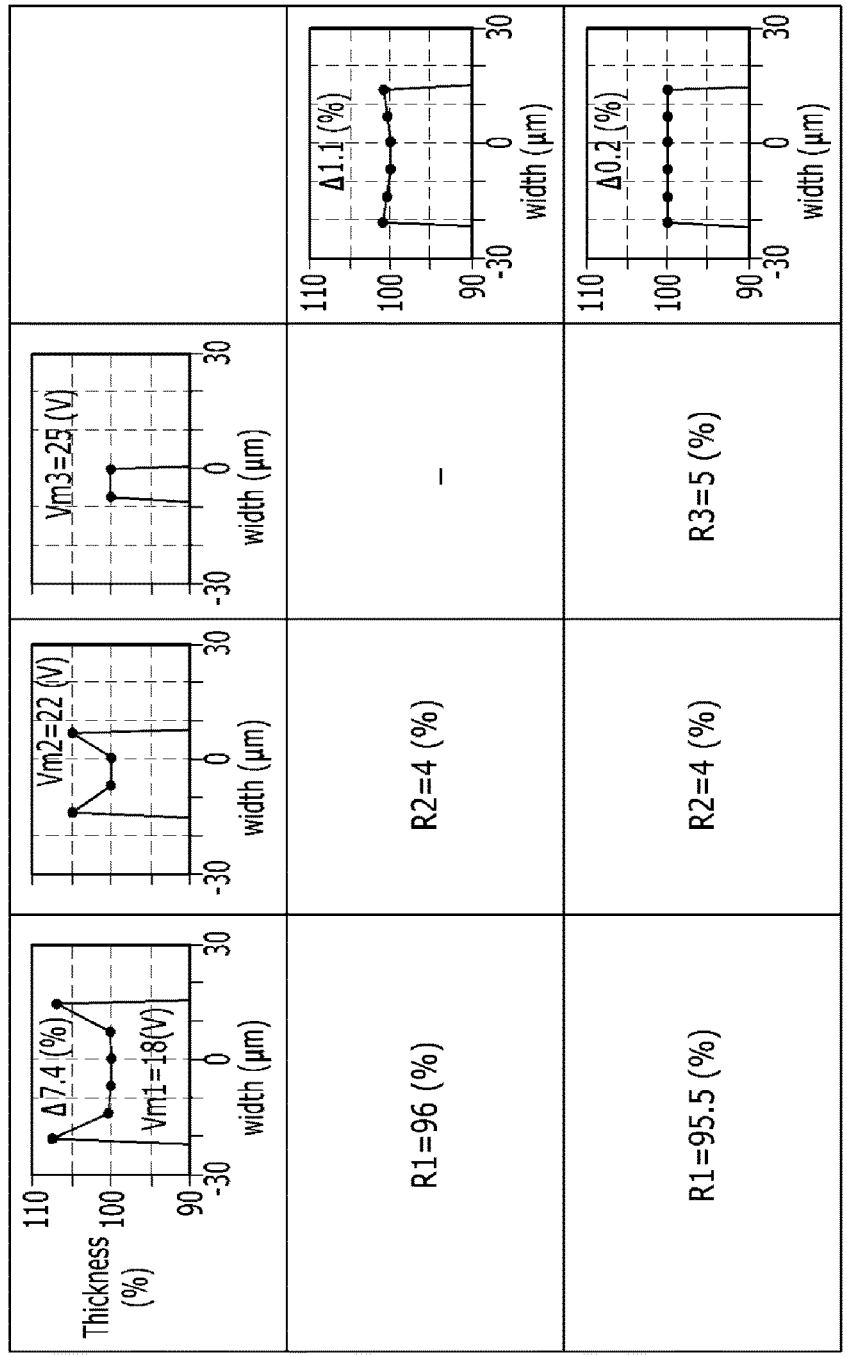

FIG. 20 shows a ratio according to aging time of the mask voltage (Vm) corresponding to Experimental Example 6 and Experimental Example 7 of Table 3 and the width and the thickness of the resultant product thin film, and FIG. 21 shows a ratio according to aging time of the mask voltage (Vm) corresponding to Experimental Example 8 and Experimental Example 9 of Table 3 and the width and the thickness of the resultant product thin film.

The thin films provided by applying the first voltage (Vm1) and the second voltage (Vm2) in FIG. 21 have similar exemplary embodiments to FIG. 20, but in the case of the thin film provided by applying the third voltage (Vm3) in FIG. 21, the obtained thin film has a shape with a very narrow width but almost no thickness error, unlike FIG. 20. This is considered to be because the number of lines of electric force passing though each pattern groove is rapidly decreased by applying the relatively high third voltage (Vm3) of 25 V to the mask 30 having a considerably narrow pattern groove interval of 80 μm.

Referring to Table 3 together with FIG. 20, it is confirmed that the obtained thin films may have different thicknesses from each other by adjusting the ratio according to aging time of the first voltage (Vm1) to the third voltage (Vm3) under the same conditions. Particularly, compared to the case of Comparative Example 3 in which the ratio (hereinafter referred to as R1) according to aging time of the first voltage (R1) is 100%, Experimental Example 6 in which the ratio (R1) of the first voltage (Vm1) according to aging time is adjusted to 95%, the ratio (hereinafter referred to as R2) of the second voltage (Vm2) according to aging time is adjusted to 5%, and the ratio (hereinafter referred to as R3) of the third voltage (Vm3) according to aging time is adjusted to 0% has significantly decreased thickness irregularity of the thin film, and Experimental Example 7 adjusting R1=94.5%, R2=5%, and R3=0.5% may have more uniform thickness of the thin film than Experimental Example 6.

Referring to Table 3 together with FIG. 21, it is confirmed that compared to Comparative Example 3, Experimental Example 6, and Experimental Example 7, when the pattern groove diameter is reduced to 80 μm, all of Comparative Example 4, Experimental Example 8, and Experimental Example 9 may provide a thin film having the same width of 35 μm, Comparative Example 4 has a high irregularity of thin film thickness due to R1=100%, in Experimental Example 8 adjusting R1=96%, R2=4%, and R3=0%, the irregularity of thin film thickness is remarkably decreased, and Experimental Example 9 adjusting R1=95.5%, R2=4%, and R3=0.5% may provide a uniform thin film with almost no thickness deviation.

In Table 3, it is confirmed that Experimental Example 7 and Experimental Example 8 applying the third voltage (Vm3) in a ratio of R3=0.5% may minimize the irregularity of thin film thickness, unlike Experimental Example 6 and Experimental Example 8 applying no third voltage (Vm3). In addition, it is understood that the pattern groove diameter change may affect only the width of the obtained thin film but may have no direct influence on the thickness deviation of the thin film.

TABLE 4

|  |  | Comparative Example 5 | Experiment 10 | Experiment 11 | Comparative Example 6 | Comparative Example 7 | Experiment 12 |
|---|---|---|---|---|---|---|---|
| V0 (V) |  | 0 | 0 | 0 | 0 | 0 | 0 |
| Va (V) |  | 1000 | 1000 | 1000 | 5000 | 5000 | 5000 |
| Pattern groove diameter (μm) |  | 140 | 140 | 140 | 80 | 80 | 80 |
| Pattern groove interval (μm) |  | 300 | 300 | 300 | 300 | 300 | 300 |
| CL (μm) |  | 100 | 100 | 100 | 50 | 50 | 50 |
| L (m) |  | 0.1 | 0.1 | 0.1 | 0.1 | 0.1 | 0.1 |
| Vm (V) | Vm1 | 1.8 | 1.8 | 1.8 | 18 | 18 | 18 |
|  | Vm2 | 2.2 | 2.2 | 2.2 | 22 | 22 | 22 |
|  | Vm3 | 3.0 | 3.0 | 3.0 | 25 | 25 | 25 |

TABLE 4-continued

|  |  | Comparative Example 5 | Experiment 10 | Experiment 11 | Comparative Example 6 | Comparative Example 7 | Experiment 12 |
|---|---|---|---|---|---|---|---|
| Ratio (%) according to aging time | R1 | 100 | 95 | 94.5 | 100 | 0 | 82 |
|  | R2 | 0 | 5 | 5 | 0 | 100 | 15 |
|  | R3 | 0 | 0 | 0.5 | 0 | 0 | 3 |
| Thin film width (μm) |  | 50 | 50 | 50 | 50 | 50 | 50 |
| Thin film thickness Δ (%) |  | 7.6 | 0.8 | 0.6 | 31.4 | 32.2 | 1.6 |

Referring to Table 4, the magnitude ratios of the dominant voltage (Va) and the mask voltage (Vm) are equivalent although the dominant voltage (Va) and the first voltage (Vm1) to the third voltage (Vm3) have different magnitudes from those of Comparative Example 3, Experimental Example 6, and Experimental Example 7, so it is confirmed that Experimental Example 10 adjusting R1=95%, R2=5%, and R3=0% or Experimental Example 11 adjusting R1=94.5%, R2=5%, and R3=0.5% tends to have a uniform thickness compared to Comparative Example 5 adjusting R1=100%.

In other words, even when applying different magnitudes of the lump voltage (Va) or the first voltage (Vm1) to the third voltage (Vm3), thin film fabricating apparatus 100 may provide a thin film with a uniform thickness by adjusting R1 to R3 which are ratios of mask voltage (Vm) according to the aging time.

Referring to Table 4, unlike the above experimental examples, even in Experimental Example 12 applying R1=82%, R2=15%, and R3=3% which significantly increases the ratio of R2 and R3 compared to Comparative Example 6 applying R1=100% or Comparative Example 7 applying R2=100%, it may also significantly improve the irregularity of thickness of thin film compared to Comparative Example 6 and Comparative Example 7.

Thus, it is confirmed that the thin film fabricating apparatus 100 according to one exemplary embodiment appropriately may minimize the deviation of the thickness of the obtained thin film by appropriate adjusting a ratio of the mask voltage (Vm) according to the aging time.

As described above, according to one exemplary embodiment, when the mask voltage (Vm) is controlled to greater than or equal to the shutter voltage (Vms), it may block the forming of a thin film 6 even without the physical shutter, so as to provide a thin film fabricating apparatus 100 which may be employed for the mass production.

In addition, when two or more constant voltages are applied to the mask voltage (Vm) for the different time during the aging time, a thin film fabricating apparatus 100 may stably form a plurality of nano-order layers in a uniform thickness.

While this disclosure has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film fabricating apparatus comprising:
   an electrode part which sprays a thin film material as electrified spray particles;
   a substrate holder which faces the electrode part and holds a substrate provided with a thin film;
   a mask disposed between the electrode part and the substrate holder and provided with a plurality of pattern grooves, and
   a plurality of spacers including an insulating material is disposed between the mask and the substrate,
   wherein the mask and the substrate are applied with a mask voltage (Vm) and a substrate voltage (V0), respectively,
   the mask voltage (Vm) is a variable voltage, and
   the mask voltage (Vm) has a same polarity as the polarity of the spray particles, and
   wherein, when the voltage of the electrode part nearest to the mask is referred to as a dominant voltage (Va), a shortest distance between the mask and the electrode part is referred to as L, and the shortest distance (CL) between the substrate and the mask is referred to as CL, and
   wherein the thin film is not disposed on the substrate when the mask voltage (Vm) is greater than or equal to a shutter voltage (Vms) which satisfies the following equation:

$$Vms = V0 + 1.07 \times 10^{-8} \times \frac{Va}{L \times CL^{1.2}}.$$

2. The thin film fabricating apparatus of claim 1, wherein the electrode part comprises a plurality of needle electrodes, and
   the dominant voltage (Va) is applied to the plurality of needle electrodes.

3. The thin film fabricating apparatus of claim 1, wherein the electrode part comprises:
   a plurality of needle electrodes; and
   a plurality of ring electrodes disposed at positions corresponding to the plurality of needle electrodes, respectively,
   wherein the dominant voltage (Va) is applied to the plurality of ring electrodes.

4. The thin film fabricating apparatus of claim 3, wherein each needle electrode is disposed on a center axis of the ring electrode.

5. The thin film fabricating apparatus of claim 1, wherein the electrode part comprises:
   a plurality of needle electrodes;
   a plurality of ring electrodes arranged with the plurality of needle electrodes to dispose the centers of the plurality of ring electrodes on extension lines of the needle electrodes; and
   a grid electrode disposed between the plurality of ring electrodes and the mask,
   wherein the dominant voltage (Va) is applied to the grid electrode.

6. The thin film fabricating apparatus of claim 1, wherein an absolute value of the dominant voltage (Va) is greater than an absolute value of the shutter voltage (Vms).

7. The thin film fabricating apparatus of claim 1, wherein the shutter voltage (Vms), the substrate voltage (V0), and the dominant voltage (Va) satisfy the following inequation:

$$\frac{(Vms - V0)}{Va} > 0.$$

8. The thin film fabricating apparatus of claim 1, wherein the shortest distance between the substrate and the mask is 30 micrometers to 3 millimeters.

9. The thin film fabricating apparatus of claim 1, wherein the mask has a thickness of 50 micrometers to 5 millimeters.

10. The thin film fabricating apparatus of claim 1, wherein an absolute value of the shutter voltage is 1.5 volts to 100 volts.

11. The thin film fabricating apparatus of claim 1, wherein an absolute value of dominant voltage is 500 volts to 20,000 volts.

12. The thin film fabricating apparatus of claim 1, wherein an absolute value of the substrate voltage (V0) is greater than 0 volt and less than or equal to 100 volts.

13. The thin film fabricating apparatus of claim 1, wherein the shortest distance between the mask and the electrode part is 0.005 meter to 0.3 meter.

14. The thin film fabricating apparatus of claim 1, when a time for forming the thin film on the substrate is referred to as an aging time,
wherein the mask voltage (Vm) shows a periodic waveform for the aging time.

15. The thin film fabricating apparatus of claim 14, wherein an absolute value of the mask voltage (Vm) is 1 volt to 100 volts for the aging time.

16. The thin film fabricating apparatus of claim 14, wherein the mask voltage (Vm) comprises
a first voltage (Vm1) and
a second voltage (Vm2) of greater than an absolute value of the first voltage (Vm1).

17. The thin film fabricating apparatus of claim 16, wherein the mask voltage (Vm) further comprises
a third voltage (Vm3) of greater than an absolute value of the second voltage (Vm2).

18. The thin film fabricating apparatus of claim 16, wherein the first voltage (Vm1) is applied for greater than or equal to 75 percent of the aging time of the mask voltage (Vm).

19. The thin film fabricating apparatus of claim 18, wherein the second voltage (Vm2) is applied for 1 percent to 20 percent of the aging time of the mask voltage (Vm).

20. The thin film fabricating apparatus of claim 19, wherein the third voltage (Vm3) is applied for 0.1 percent to 5 percent of the aging time of the mask voltage (Vm).

* * * * *